United States Patent
Li et al.

(10) Patent No.: US 9,846,240 B2
(45) Date of Patent: Dec. 19, 2017

(54) MULTI-LEVEL/MULTI-THRESHOLD/MULTI-PERSISTENCY GPS/GNSS ATOMIC CLOCK MONITORING

(71) Applicant: The Boeing Company, Chicago, IL (US)

(72) Inventors: Rongsheng Li, Hacienda Heights, CA (US); Kamran Ghassemi, Orange, CA (US)

(73) Assignee: The Boeing Company, Chicago, IL (US)

( * ) Notice: Subject to any disclaimer, the term of this patent is extended or adjusted under 35 U.S.C. 154(b) by 801 days.

(21) Appl. No.: 14/313,705

(22) Filed: Jun. 24, 2014

(65) Prior Publication Data
US 2016/0245921 A1    Aug. 25, 2016

Related U.S. Application Data

(60) Provisional application No. 61/927,860, filed on Jan. 15, 2014.

(51) Int. Cl.
*G01S 19/20* (2010.01)
*H03L 7/087* (2006.01)
(Continued)

(52) U.S. Cl.
CPC .............. *G01S 19/20* (2013.01); *G01S 19/02* (2013.01); *G01S 19/235* (2013.01); *G01S 19/40* (2013.01);
(Continued)

(58) Field of Classification Search
CPC ........ G01S 19/20; G01S 19/40; G01S 19/235; G01S 19/42; H03L 7/0991; H03L 7/087;
(Continued)

(56) References Cited

U.S. PATENT DOCUMENTS 4,899,117 A     2/1990   Vig
5,274,545 A    12/1993   Allan et al.
(Continued)

FOREIGN PATENT DOCUMENTS

WO        2008019605        2/2008

OTHER PUBLICATIONS

European Patent Office, "Extended European Search Report," issued in connection with European Patent Application No. 14198176.1, dated May 30, 2016, 5 pages.
(Continued)

*Primary Examiner* — Arnold Kinkead
(74) *Attorney, Agent, or Firm* — Hanley, Flight & Zimmerman, LLC

(57) ABSTRACT

Methods and apparatus to monitor GPS/GNSS atomic clocks are disclosed. An example method includes establishing a measured difference between an atomic frequency standard (AFS) and a monitoring device. The method also includes modeling an estimated difference model between the AFS and the monitoring device, and computing a residual signal based on the measured difference and the estimated difference model. In addition, the method includes analyzing, by a first detector, the residual signal at multiple thresholds, each of the thresholds having a corresponding persistency defining the number of times a threshold is exceeded before one or more of a phase jump, a rate jump, or an acceleration error is indicated. Furthermore, the method includes analyzing, by a second detector, a parameter of the estimated difference model at multiple thresholds, each of the thresholds having a corresponding persistency defining the number of times a drift threshold is exceeded before a drift is indicated.

20 Claims, 13 Drawing Sheets

(51) Int. Cl.
   H03L 7/099    (2006.01)
   G01S 19/23    (2010.01)
   H04L 27/00    (2006.01)
   G01S 19/42    (2010.01)
   G01S 19/40    (2010.01)
   G04F 5/14     (2006.01)
   G01S 19/02    (2010.01)

(52) U.S. Cl.
   CPC ............... *G01S 19/42* (2013.01); *G04F 5/14* (2013.01); *H03L 7/087* (2013.01); *H03L 7/0991* (2013.01); *H04L 27/00* (2013.01)

(58) Field of Classification Search
   CPC . H03J 7/04; H04B 1/707; H04L 27/00; G04F 5/145
   USPC ... 342/357.58, 357.23, 357.1, 357.4, 357.64, 342/357.66, 357.74, 357.77; 375/147; 701/469
   See application file for complete search history.

(56)   References Cited

U.S. PATENT DOCUMENTS

2005/0024157 A1    2/2005   Duven
   2005/0114023 A1*   5/2005   Williamson ......... G01C 21/165
                                                          701/472
   2006/0074558 A1*   4/2006   Williamson ......... G01C 21/165
                                                          701/469

OTHER PUBLICATIONS

European Patent Office, "Communication pursuant to Article 94(3) EPC," issued in connection with European Patent Application No. 14198176.1, dated Sep. 26, 2016, 5 pages.

Weiss et al., "On-Board GPS Clock Monitoring for Signal Integrity," 42nd Annual Precise Time and Time Interval Systems and Applications Meeting, Reston, Virginia, Nov. 2010, pp. 465-479, 15 pages.

Andy Wu, "Performance Evaluation of the GPS Block IIR Time Keeping System," 28th Annual Precise Time and Time Interval Applications and Planning Meeting, Reston, Virginia, Dec. 1996, 14 pages.

Galleani et al., "Detection of Atomic Clock Frequency Jumps With the Kalman Filter," IEEE Transactions on Ultrasonics, Ferroelectrics, and Frequency Control, vol. 59, No. 3, Mar. 2012, 6 pages.

* cited by examiner

MULTI-LEVEL/MULTI-THRESHOLD/MULTI-PERSISTENCY GPS/GNSS ATOMIC CLOCK MONITORING

RELATED APPLICATION

This application claims the benefit under 35 U.S.C. §119 (e) to U.S. Provisional Application 61/927,860 titled "MULTI-LEVEL/MULTI-THRESHOLD/MULTI-PERSISTENCY GPS/GNSS ATOMIC CLOCK MONITORING," filed Jan. 15, 2014, which is incorporated herein by this reference in its entirety.

FIELD OF THE DISCLOSURE

This disclosure relates generally to global positioning systems (GPS) and global navigation satellite systems (GNSS) and, more particularly, to GPS/GNSS atomic clock monitoring using multi-level, multi-threshold, and multi-persistency analysis.

BACKGROUND

The U.S. global positioning system (GPS) is a type of GNSS system including a constellation of space vehicles (e.g., satellites) that orbit the earth to provide navigation and positioning signals to GPS/GNSS receivers or navigation devices. Millions of GPS/GNSS receivers or navigation devices capable of receiving and using GPS/GNSS signals are in use by the general public and government entities.

A GPS/GNSS receiver calculates its position by precise timing of the signals sent by GPS/GNSS space vehicles. Each space vehicle continually transmits navigation messages that include (1) the time the message was transmitted and (2) space vehicle position at the time of message transmission. The receiver analyzes the navigation messages received from a minimum of four GPS/GNSS space vehicles. The receiver determines the transit time of each navigation message and computes the respective distances to each space vehicle using the speed of light. Knowing the distance from the receiver to each space vehicle and each space vehicle's respective position, the receiver determines its position in three absolute spatial coordinates and one absolute time coordinate.

Precise timing is critical to high precision tracking and navigation in GPS/GNSS systems. As such, GPS/GNSS space vehicles utilize high precision atomic frequency standards (AFS), such as rubidium atomic clocks, for timing. AFSs can exhibit various clock anomalies that can introduce significant errors in GPS/GNSS navigation and tracking if left undetected.

SUMMARY

An example method disclosed herein includes establishing a difference between an atomic frequency standard (AFS) and a monitoring device. The method also includes modeling an estimated difference model between the AFS and the monitoring device, and computing a residual signal based on the measured difference and the estimated difference model. In addition, the method includes analyzing, by a first detector, the residual signal at multiple thresholds, each of the thresholds having a corresponding persistency defining the number of times a threshold is exceeded before one or more of a phase jump, a rate jump, or an acceleration error is indicated. Furthermore, the method includes analyzing, by a second detector, a parameter of the estimated difference model at multiple thresholds, each of the thresholds having a corresponding persistency defining the number of times a drift threshold is exceeded before a drift is indicated.

An example apparatus disclosed herein includes a meter, an estimator, an analyzer, a first detector, and a second detector. The meter is to measure a difference between an atomic frequency standard (AFS) and a monitoring device. The estimator is to model an estimated difference between the AFS and the monitoring device. The analyzer is to compute a residual signal based on the measured difference and the estimated difference. The first detector is to analyze the residual signal at multiple thresholds, each of the thresholds having a corresponding persistency defining the number of times a threshold is exceeded before one or more of a phase jump, a rate jump, or an acceleration error is indicated. The second detector is to analyze a parameter of the estimated difference at multiple thresholds, each of the thresholds having a corresponding persistency defining the number of times a drift threshold is exceeded before a drift is indicated.

Another example method includes establishing a measured difference between an atomic frequency standard (AFS) and a monitoring device, and modeling an estimated difference model between the AFS and the monitoring device. The example method also includes detecting, by a detector, a drift if a parameter of the estimated difference model exceeds a threshold at a corresponding persistency defining the number of times that a drift threshold is exceeded before a drift is indicated.

The features, functions, and advantages that have been discussed can be achieved independently in various examples or may be combined in yet other examples further details of which can be seen with reference to the following description and drawings.

BRIEF DESCRIPTION OF THE DRAWINGS

Wherever appropriate, the same reference numbers will be used throughout the drawing(s) and accompanying written description to refer to the same or like parts.

DETAILED DESCRIPTION

Figure 1:
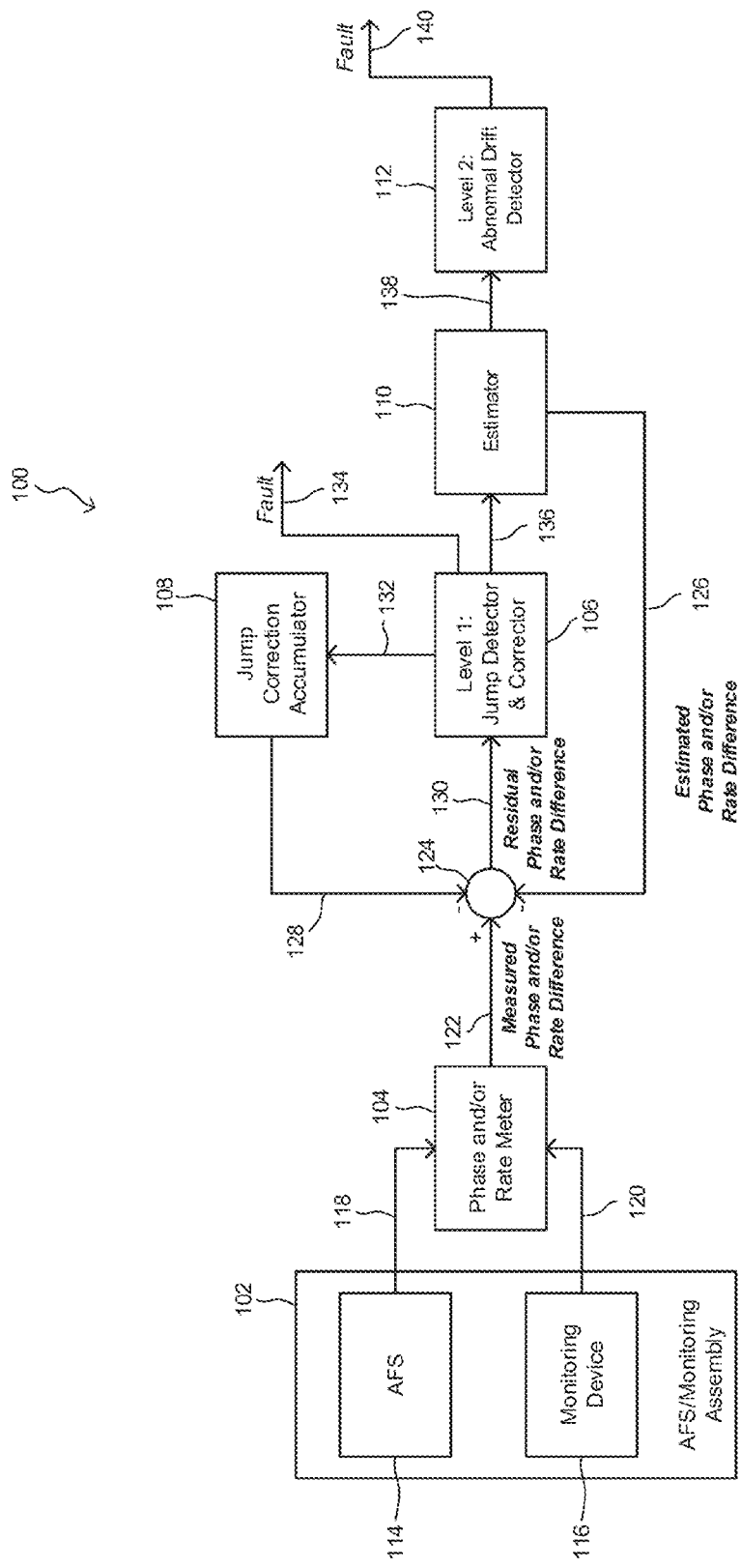
FIG. 1 illustrates a block diagram of an example atomic clock monitoring system.

Global Positioning Systems (GPS) and Global Navigation Satellite Systems (GNSS) utilize atomic frequency standards (AFS), such as rubidium atomic clocks to maintain precise timing. AFSs, such as rubidium atomic clocks, are subject to various anomalies, including frequency jumps, phase jumps, frequency rate jumps, and abnormal frequency drifts. Anomalies such as these can cause an end user to determine their position, velocity and time with significant errors if the anomalies are not properly detected and handled.

Monitoring, detection, and response of clock anomalies can be performed at an end-user's GPS/GNSS receiver, at a GPS/GNSS ground control segment, or at a GPS/GNSS space vehicle (e.g., satellite) with different performance characteristics associated with each location.

Example methods and apparatus disclosed herein enable monitoring, detection, and response to GPS/GNSS atomic clock anomalies on-board a space vehicle. On-board clock monitoring provides the most effective time-to-alert, service availability, and continuity. By identifying clock anomalies on-board, where the clock signals are generated, the anomalies can be detected quickly and alerts can be transmitted immediately. In certain examples, clock anomalies can be corrected before erroneous signals are transmitted from a space vehicle, thereby avoiding misleading information from being transmitted and thereby improving service availability and/or continuity.

Example methods and apparatus disclosed herein include various clock monitoring architectures. In certain examples, existing components are utilized to perform clock monitoring without requiring additional hardware. For example, an existing oscillator, such as a crystal oscillator (CXO), voltage controlled crystal oscillator (VCXO) and/or numerically controlled crystal oscillator (NCO) may be utilized to perform clock monitoring in accordance with the examples described herein. In certain examples, components such as these are included in the system to perform various functions, such as frequency up-conversion. By utilizing existing components to perform clock monitoring, additional capabilities can be implemented with minimal additional cost.

A first example clock monitoring architecture monitors an AFS by comparing the phase and/or rate of the AFS signal against the phase and/or rate of another clock, such as a CXO. A second example clock monitoring architecture monitors an AFS by comparing phase change and/or rate change of an AFS signal over a fixed delay interval. Each of the first and second example clock monitoring architectures includes multiple implementation variations at various levels of performance and cost.

Example methods and apparatus disclosed utilize innovative analysis techniques to provide comprehensive atomic clock monitoring capabilities that are beyond the capabilities of known systems. At a high level, these techniques include multi-level detection, including multi-threshold and multi-persistency analysis for each detection level.

Multi-level detection provides detectors at various levels to detect particular types of anomalies. Examples include a level 1 detector and a level 2 detector. The level 1 detector detects large anomalies quickly, whereas the level 2 detector detects small anomalies over a longer period of time. At each detection level, multi-threshold and multi-persistency analysis includes predetermined thresholds based on measurement values, with persistency requirements associated with each threshold. Persistency refers to the number of times that a measurement at a particular threshold must be realized (e.g., the number of times the measurement meets or exceeds the threshold) before an anomaly is detected or indicated.

In operation, large and obvious anomalies are detected and reported or corrected quickly by using larger thresholds with less persistency, thereby detecting and correcting anomalies before a system becomes contaminated. In addition, smaller and less obvious anomalies are detected over a longer period of time by using tighter thresholds with more persistency, thereby detecting small anomalies while avoiding false alarms resulting from noise, for example.

Upon detecting such anomalies, the impact of the respective anomalies to user range error (URE) are evaluated, which can provide a basis for operational decisions and warnings to an end user. In certain examples, warnings and impact predictions are included in navigation messages. In other examples, anomalies (e.g., jumps or drifts) are corrected on-board to maintain accurate performance without compromising system availability.

In contrast to known methods for correcting atomic clock anomalies, example methods and apparatus disclosed herein are designed to achieve high performance GPS/GNSS atomic clock monitoring at low cost, while minimizing the probability of false alarms and missed detections. High performance clock monitoring includes, for example, the ability to detect very small anomalous events (e.g., frequency jumps smaller than $10^{-12}$ seconds/second).

Turning to FIG. 1, a block diagram of an example atomic clock monitoring system 100 is illustrated. The system 100 includes an Atomic Frequency Standard (AFS)/monitoring assembly 102, a meter 104, a level 1 detector 106, a jump correction accumulator 108, an estimator 110, and a level 2 detector 112.

The AFS/monitoring assembly 102 of the illustrated example includes an AFS 114 and a monitoring device 116. Although shown as an assembly, the AFS 114 and the monitoring device 116 can be implemented as integrated devices or are separate devices. In certain examples, the AFS 114 is a rubidium clock and the monitoring device 116 is a CXO. In other examples, the monitoring device 116 is a VCXO, an NCO, or a combination of one or more CXOs, VCXOs, and/or NCOs. The AFS 114 produces an AFS signal 118 and the monitoring device 116 produces a monitoring device signal 120.

In this example, the AFS signal 118 and the monitoring device signal 120 are received by the meter 104. The meter 104 can be a phase meter and/or a rate meter that measures phase and/or rate difference(s) between the AFS signal 118 and the monitoring device signal 120. The meter 104 outputs measured phase and/or rate difference(s) 122 between the AFS signal 118 and the monitoring device signal 120.

An analyzer 124 receives the measured phase and/or rate difference(s) 122 from the meter 104, estimated phase and/or rate difference(s) 126 from the estimator 110, and accumulated jump corrections 128 from the jump correction accumulator 108. The analyzer 124 subtracts the estimated phase and/or rate difference(s) 126 and the accumulated jump corrections 128 from the measured phase and/or rate difference(s) 122 to compute residual phase and/or rate difference(s) 130.

The level 1 detector 106 of the illustrated example compares the residual phase and/or rate difference(s) 130 to a threshold to detect and correct jumps using multi-threshold and multi-persistency analysis techniques, as mentioned above. For example, lower thresholds may require higher persistency (e.g., the number of times that a measurement at a particular threshold must be realized before an anomaly is detected or indicated) in order to properly identify jumps while avoiding false positives due to noise. The residual phase difference can be used to detect phase jumps (e.g., a level 1 phase detector). In an example, a phase jump is detected if a residual phase difference is above a predetermined threshold (e.g., pTH) at a persistency of a predetermined number (e.g., nP) of iterations. In a further example, a rate jump is detected if a residual rate difference is above a predetermined threshold (e.g., rTH) at a persistency of a predetermined number (e.g., nR) of iterations. In certain examples, upon detecting a jump, the level 1 detector 106 computes a jump correction 132. The jump correction accumulator 108 accumulates the jump corrections 132 and outputs the accumulated jump corrections 128 to the analyzer 124. In addition, the level 1 detector 106 outputs a fault indicator 134 to indicate a phase jump or a rate jump. In certain examples in which faults are not automatically corrected, the fault indicator 134 can be included in navigation messages to alert receivers of faults in the clock signal or remove the navigation signals to protect the users from anomalous events. In some examples, the level 1 detector 106 additionally computes a corrected residual phase and/or rate difference(s) 136 for newly detected jumps by removing a portion of the residual phase and/or rate difference(s) 130 contributed by the accumulated jumps 128.

The estimator 110 of the illustrated example models the estimated phase and/or rate difference(s) 126 between the AFS signal 118 and the monitoring device signal 120. In certain examples, the estimator 110 includes a Kalman filter or a fixed gain filter. The particular parameters of the mathematical model utilized by the estimator 110 are discussed in detail below. The estimator 110 receives the corrected residual phase and/or rate difference(s) 130 from the level 1 detector 106, which it utilizes to update its model. The estimated phase and/or rate difference(s) 126 is outputted to the analyzer 124. The estimator 110 also outputs a parameter 138 associated with its model of the estimated phase and/or rate difference(s) 126 to the level 2 detector 112. In an example, the parameter 138 is an estimated rate bias.

The level 2 detector 112 receives the parameter 138 (e.g., estimated rate bias), which is analyzed to detect slower, more subtle anomalous drifting. In an example, a level 2 anomaly is detected if the change in the rate bias estimate over a time period (e.g., dt) is above a predetermined threshold (drTH) at a persistency of a predetermined number (e.g., nDR) of iterations. In addition, the level 2 detector 112 outputs a fault indicator 140 to indicate an abnormal drift of the parameter 138 (e.g., estimated rate bias). In certain examples in which faults are not automatically corrected, the fault indicator 140 can be included in navigation messages to alert receivers of faults in the clock signal or other actions including removal of the navigation signal, for example, may be taken to protect the user from anomalous signal(s).

Figure 2:
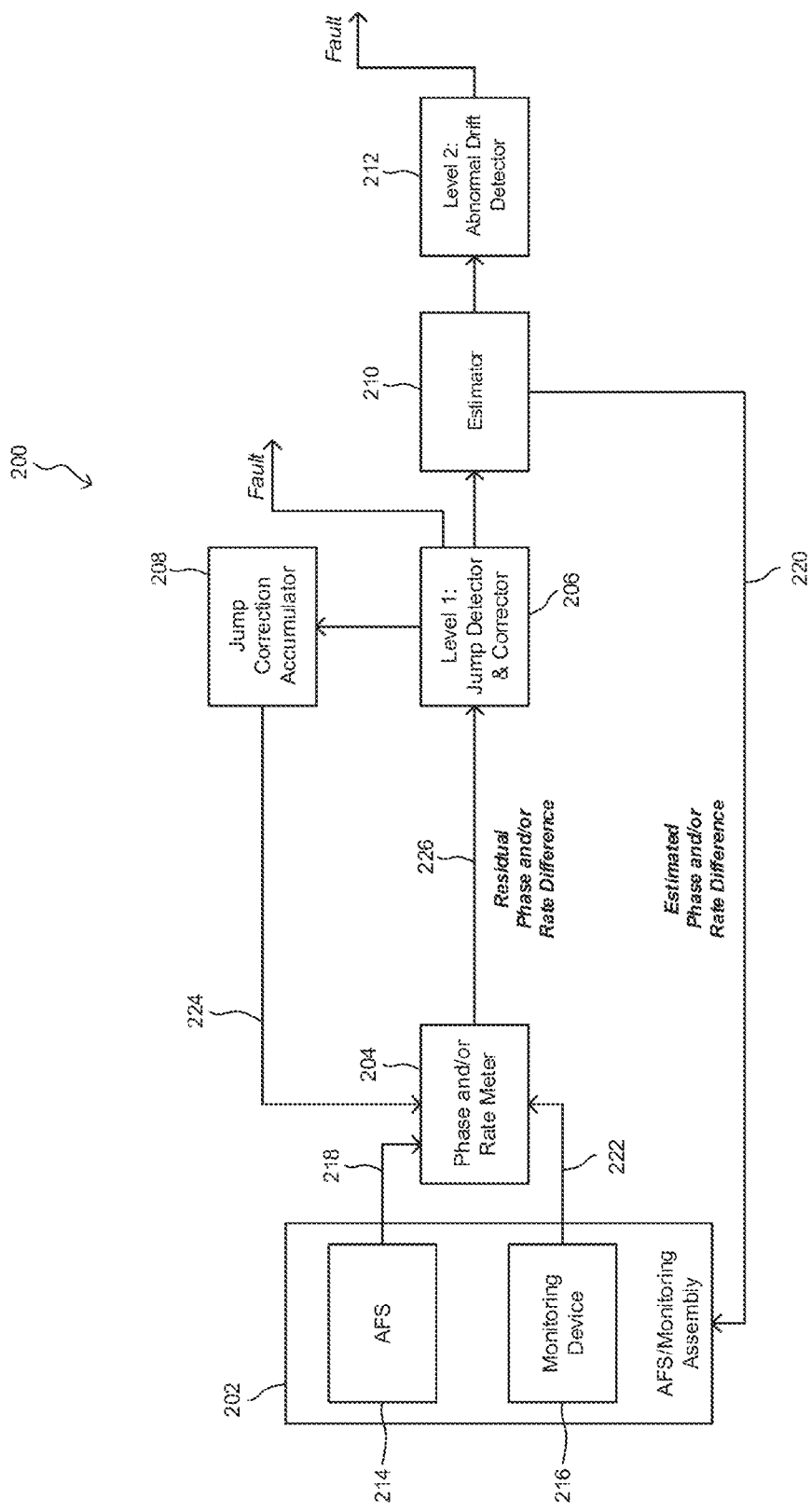
FIG. 2 illustrates a block diagram of a second example atomic clock monitoring system.

Turning to FIG. 2, a block diagram of another example atomic clock monitoring system 200 is illustrated. The system 200 is an alternative configuration of the system 100 of FIG. 1. The system 200 of FIG. 2 depicts a hardware loop closure configuration, whereas the system 100 of FIG. 1 utilizes a software loop closure configuration.

The system 200 of FIG. 2 includes an AFS/monitoring assembly 202, a meter 204, a level 1 detector 206, a jump correction accumulator 208, an estimator 210, and a level 2 detector 212.

The AFS/monitoring assembly 202 includes an AFS 214 and a monitoring device 216. In certain examples, the AFS 214 is a rubidium clock and the monitoring device 216 is a CXO. In other examples, the monitoring device 216 is a VCXO, an NCO, or a combination of one or more CXOs, VCXOs, and/or NCOs. The AFS 214 produces an AFS signal 218.

The AFS/monitoring assembly 202 of the illustrated example receives estimated phase and/or rate difference(s) 220 from the estimator 210. This configuration is different than the configuration of the system 100 of FIG. 1 in which the estimated phase and/or rate difference(s) 126 are received by the analyzer 124. The monitoring device 216 of the AFS/monitoring device assembly 202 receives the estimated phase and/or rate difference(s) 220. The monitoring device 216 produces a tracked AFS signal 222 based on the estimated phase and/or rate difference(s) 220.

The meter 204 receives the AFS signal 218, the tracked AFS signal 222, and accumulated jump corrections 224. The meter 204 can be a phase meter and/or a rate meter that measures the differences between the AFS signal 218 and the tracked AFS signal 222, including the accumulated jump corrections 224 in terms of phase and/or rate. The result of this measurement is a residual phase and/or rate difference(s) 226.

The remaining architecture of the system 200 of FIG. 2 is similar to that of the system 100 of FIG. 1. Thus, the system 200 of FIG. 2 illustrates an alternative configuration of the system 100 of FIG. 1 that utilizes a hardware-based closed loop control system as opposed to a software-based closed loop control system to achieve the same or similar functionality.

Figure 3:
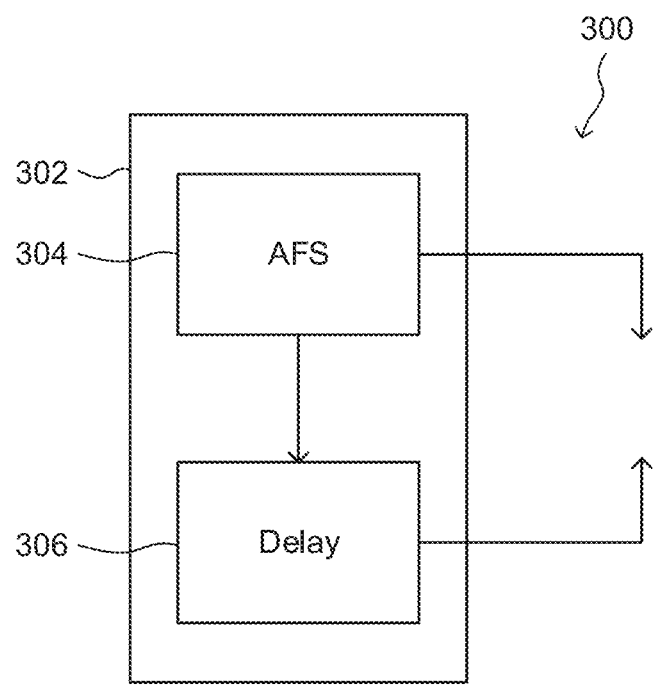
FIG. 3 illustrates an example atomic clock monitoring system including an independent clock-based monitoring approach
Figure 4:
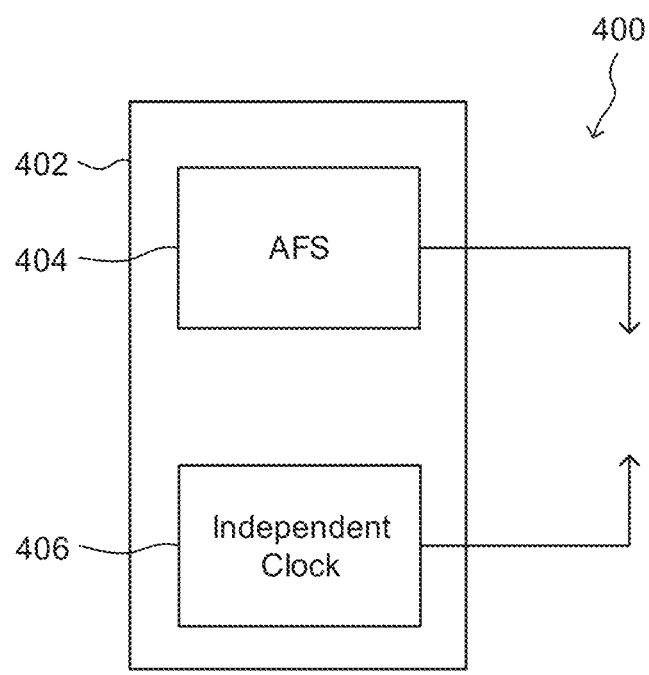
FIG. 4 illustrates an example atomic clock monitoring system including a delay-based approach.

Turning now to FIGS. 3 and 4, example configurations of the AFS/monitoring assembly 102 and 202 of FIGS. 1 and 2 are illustrated, which provide different approaches to clock monitoring. FIG. 3 illustrates clock monitoring using a delay-based configuration 300, and FIG. 4 illustrates clock monitoring using an independent clock-based monitoring configuration 400.

Each of the independent clock-based and delay-based configurations is capable of detecting and correcting phase jump, detecting and correcting rate jump above a predetermined threshold, and testing estimated rate bias over time against expectations. Certain configurations, however, are better suited for particular applications. For example, various delay-based configurations 300 and clock-based monitoring configurations 400 exhibit varied performance in terms of short-term and long-term stability, cost and the ability to swap hardware, the opportunity to use existing hardware, and failure and/or fault mechanisms of hardware (e.g., whether voting schemes are needed).

FIG. 3 illustrates clock monitoring using the delay-based configuration 300. The delay-based configuration 300 includes an example AFS/monitoring assembly 302, including an AFS 304 (e.g., a rubidium clock) and a delayed signal 306 of the AFS 304. Fundamentally, this configuration facilitates the comparison of clock phase and rate change over a delay period against the delay, which essentially operates as a short-term clock. The phase and rate difference compensated by known values (e.g., the delay value) are used to detect faults. The phase difference is essentially a test of the rate. Phase jumps appear as intermittent spikes, whereas rate jumps appear as steps.

In certain examples, a Kalman filter or a fixed gain filter is used to estimate AFS rate bias with respect to accuracy of the delay, and/or AFS acceleration error with respect to accuracy of the delay. In certain examples, delay stability can be quantified, thereby allowing improved accuracy of estimated AFS rate bias.

Various configurations may be utilized for the delay-based approach of FIG. 3. A first configuration utilizes an oscillator-based delay mechanism. A second configuration includes a delay line.

Turning to FIG. 4, clock monitoring using the independent clock-based monitoring configuration 400 is illustrated. The independent clock-based monitoring configuration 400 includes an example AFS/monitoring assembly 402, including an AFS 404, such as a rubidium clock, and an independent clock 406, such as a CXO. In other examples, the independent clock 406 is a VCXO, an NCO, or a combination of one or more CXOs, VCXOs, and/or NCOs.

Various configurations may be utilized for the independent clock-based approach of FIG. 4, such as those shown and described in connection with FIGS. 5-7.

Figure 5:
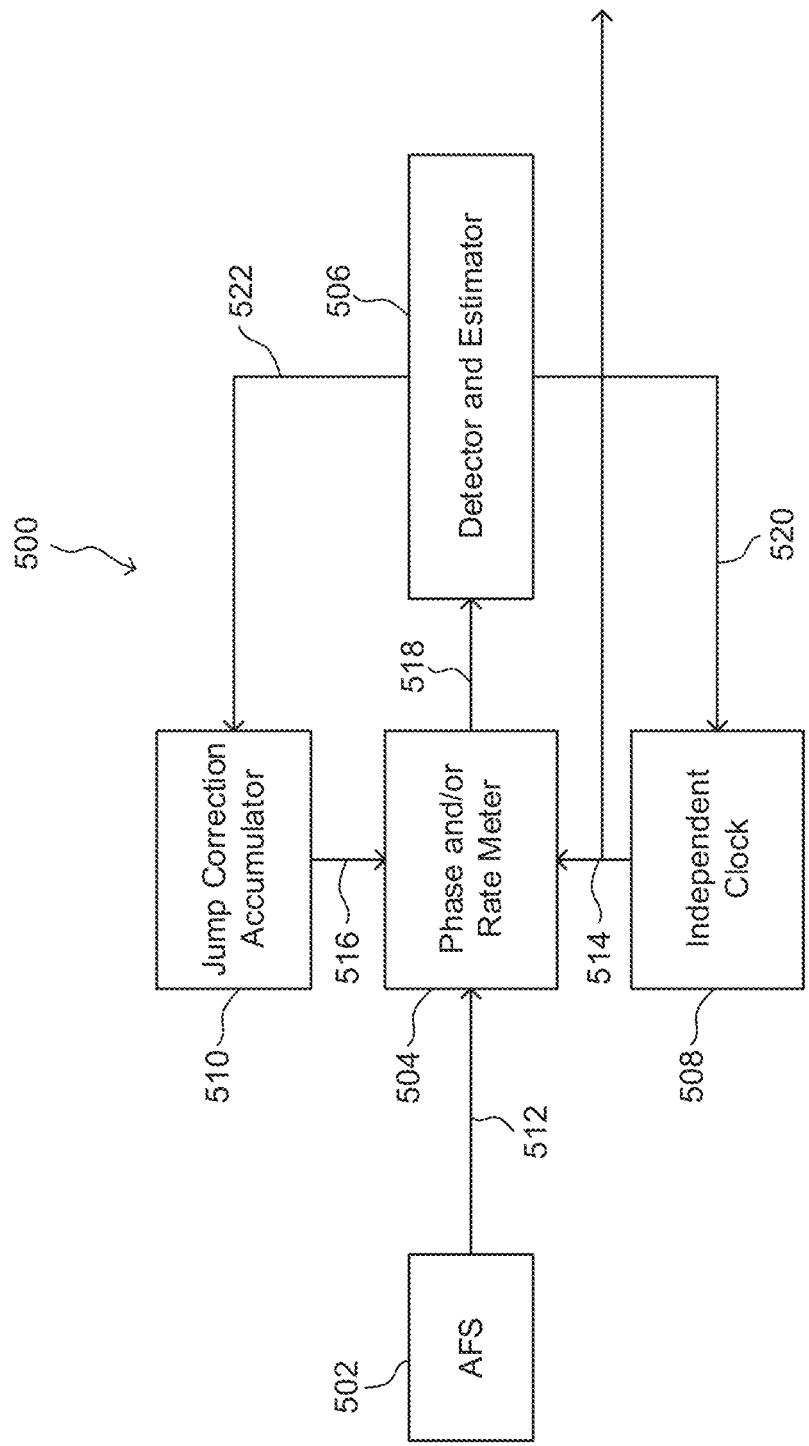
FIG. 5 illustrates an independent clock-based monitoring system that utilizes a voltage-controlled crystal oscillator (VCXO) or a numerically-controlled crystal oscillator (NCO).

FIG. 5 illustrates an example independent clock-based monitoring system 500 that utilizes a VCXO or an NCO. In this configuration, a VCXO or an NCO, in which existing clock or signal generation architecture may be utilized to perform fault detection, isolation, and response. This configuration provides cost savings over alternative configurations by utilizing existing components.

The example system 500 includes an AFS 502, a phase and/or rate meter 504, a detector and estimator 506, an independent clock 508, and a jump correction accumulator 510. The AFS 502 produces an AFS signal 512, which is received by the phase and/or rate meter 504. The phase and/or rate meter 504 also receives a corrected tracked AFS signal 514 from the independent clock 508 and accumulated jump corrections 516 from the jump correction accumulator 510.

The detector and estimator 506 models the estimated phase and/or rate difference(s) between the AFS 502 and the independent clock 508. The detector and estimator 506 receives a residual phase and/or rate difference(s) 518 from the phase and/or rate meter 504, which it utilizes to update its model. The detector and estimator 506 outputs estimated phase and/or rate difference(s) 520 to the independent clock 508. The detector and estimator 506 detects phase and/or rate jumps based on the residual phase and/or rate difference(s) 518 received from the phase and/or rate meter 504. Detected phase and/or rate jumps 522 are outputted to the jump correction accumulator 510.

The independent clock 508 produces a clock signal that tracks the AFS clock signal 512. The independent clock 508 then adjusts its clock signal (e.g., a tracked AFS signal) based on the estimated phase and/or rate difference(s) 520 received from the detector and estimator 506. Thus, the independent clock 508 outputs a corrected tracked AFS signal 514 to the phase and/or rate meter 504.

The meter 504 receives the AFS signal 512, the corrected tracked AFS signal 514 and accumulated jump corrections 516. The meter 504 can be a phase meter and/or a rate meter that measures the difference between the AFS signal 512 and the corrected tracked AFS signal 514, including the accumulated jump corrections 516, in terms of phase and/or rate. The result of this measurement is a residual phase and/or rate difference(s) 518.

Figure 6:
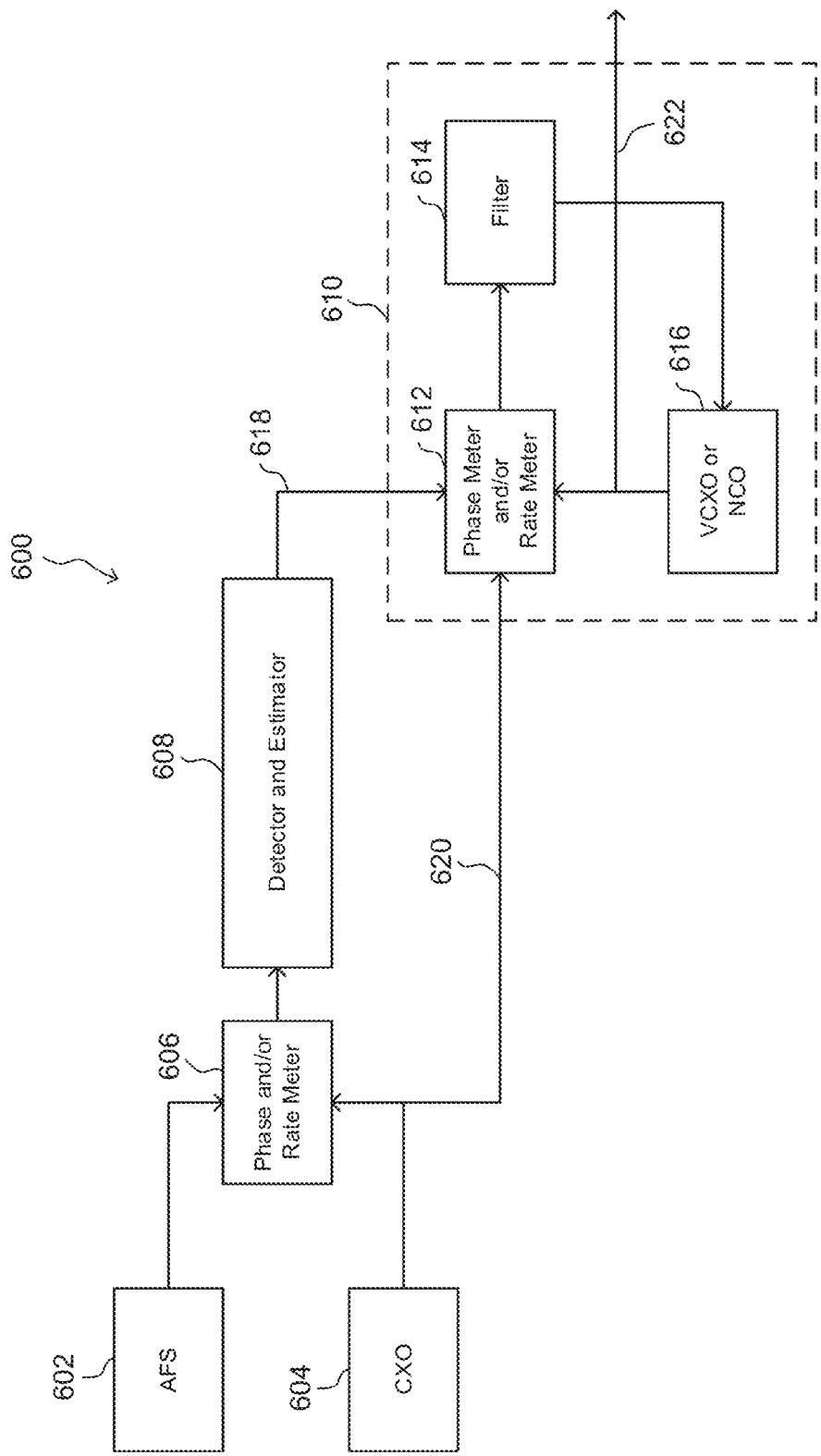
FIG. 6 illustrates an independent clock-based monitoring system that utilizes a high-quality crystal oscillator (CXO) together with a relatively lower-cost VCXO or NCO to form a phase-locked loop.

FIG. 6 illustrates an example independent clock-based monitoring system 600 that utilizes a high-quality CXO together with a relatively lower-cost VCXO or NCO to form a phase-locked loop. The example system 600 includes an AFS 602, a CXO 604 that operates as an independent clock, a phase and/or rate meter 606, a detector and estimator 608, and a phase-locked loop 610. The phase-locked loop 610 includes a phase meter and/or a rate meter 612, a filter 614 (e.g., a Kalman or fixed-gain filter), and a VCXO or NCO 616.

Similar to the systems described above, the detector and estimator 608 outputs phase and/or rate corrections 618. The phase-locked loop 610 receives the phase and/or rate corrections 618 and a clock signal 620, which can be an AFS clock signal or a CXO clock signal.

The phase-locked loop 610 is utilized in this example to implement the phase and/or rate corrections 618 as corrected clock signals 622. Implementations of the system 600 also include digital-to-analog and analog-to-digital converters as needed.

Figure 7:
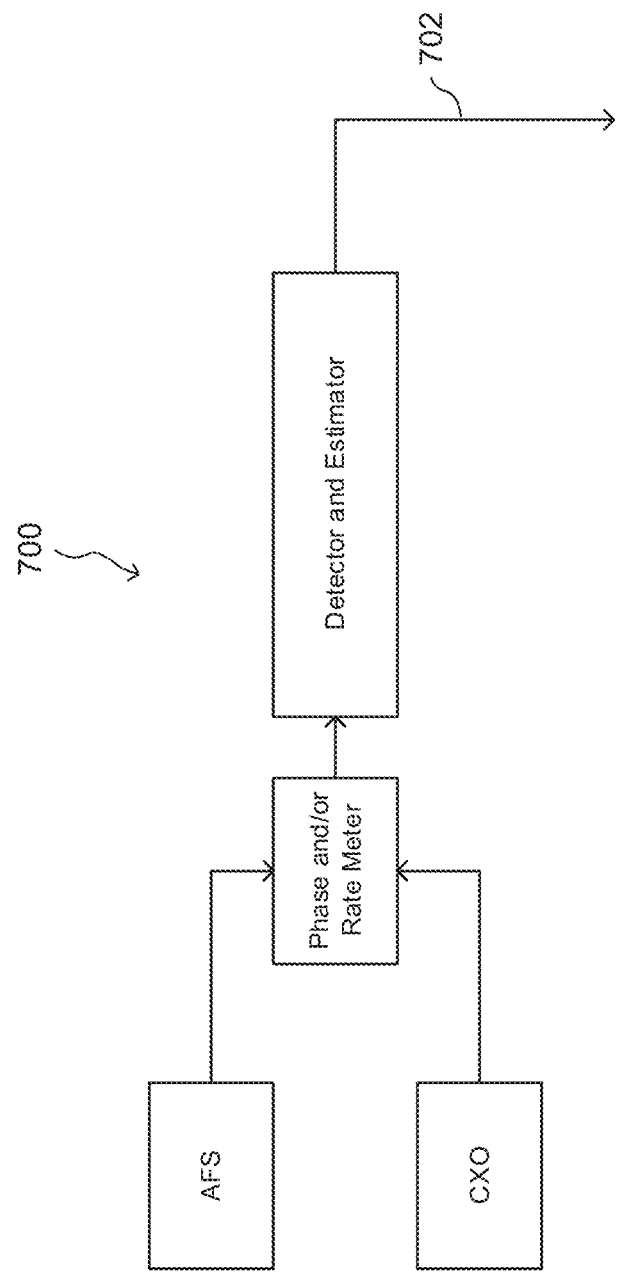
FIG. 7 illustrates an independent clock-based monitoring system that utilizes a high-quality CXO without applying corrections.

FIG. 7 illustrates an example independent clock-based monitoring system 700 that utilizes a high-quality CXO without applying corrections. The example system 700 is similar to the system 600 of FIG. 6, except the system 700 does not include the phase-locked loop 610. The system 700 may be implemented in applications in which clock monitoring features are desired but hardware capabilities are limited. The system 700 operates similar to the systems described above and provides phase and/or rate corrections 702. In certain examples, the phase and/or rate corrections 702 can be included in navigation data messages. Additionally or alternatively, the navigation signal may be removed when defined thresholds are exceeded to protect users.

For each of the example atomic clock monitoring configurations described above, the source of anomalies may be identified and the source of the anomalies may be isolated if the anomalies cannot be corrected. Certain examples utilize redundancy, voting, and/or other mechanisms to perform these functions. In certain examples, redundancy is avoided by utilizing other mechanisms, such as by monitoring AFS telemetry such as lamp voltage.

Figure 8:
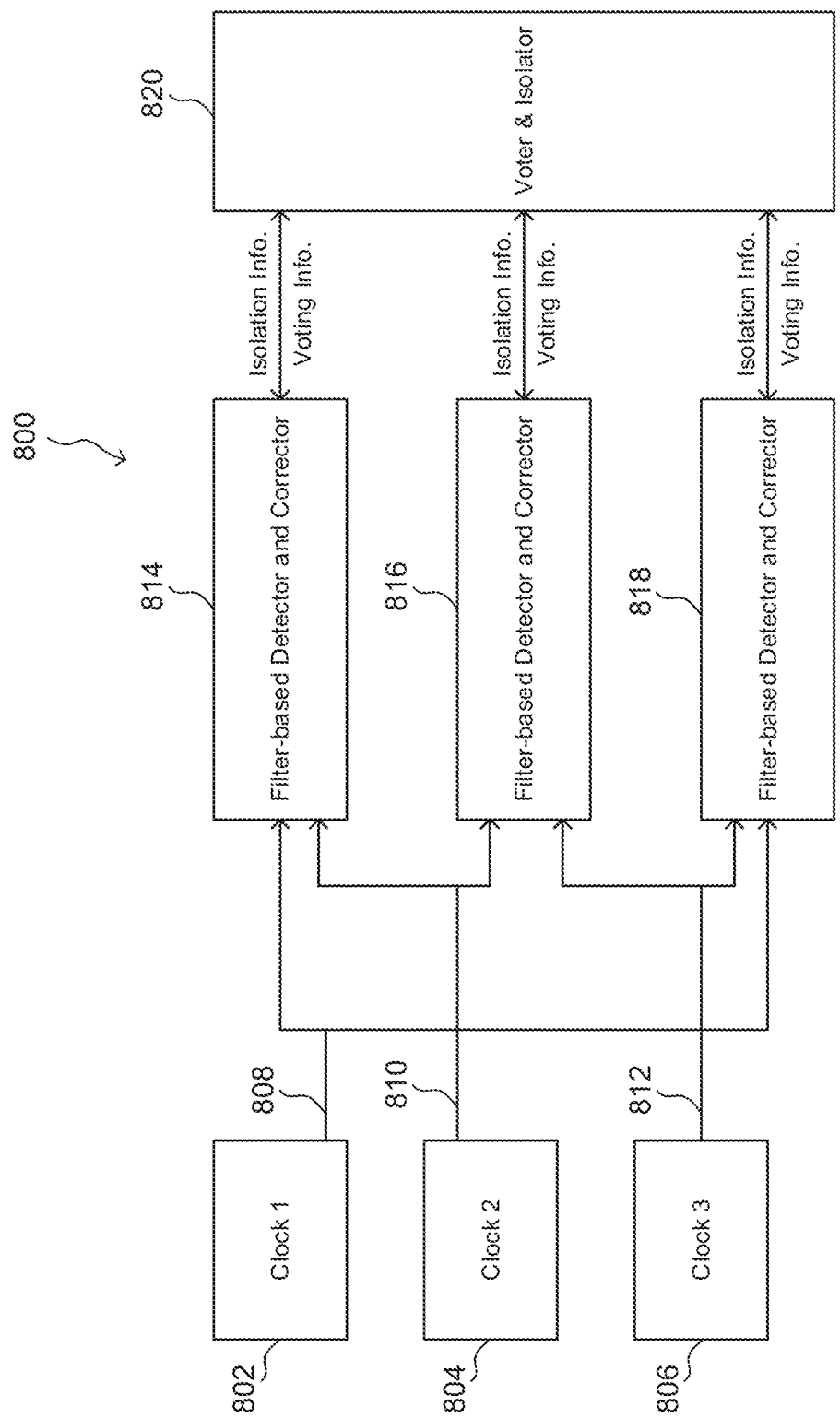
FIG. 8 illustrates an example top level voting architecture.

FIG. 8 illustrates an example top level voting architecture 800. The example voting architecture 800 can be implemented in any of the examples described above to identify and isolate the source(s) of clock anomalies. The example voting architecture 800 can be implemented by adding additional operating clocks to a system. In general, three or more operating clocks are used to detect and isolate a frequency or phase anomaly.

In certain examples, if a clock anomaly in terms of phase and frequency is sufficiently low, redundancy and voting architectures may be omitted. Instead, detections caused by monitoring system clock jumps may be considered noise. Such noise is accounted for by altering persistency values to control the probability of false alarms.

The example voting architecture 800 includes a first clock 802, a second clock 804, and a third clock 806. The first, second, and third clocks 802, 804, 806 can be any combination of AFSs (e.g., rubidium clocks) and/or crystal oscillators (e.g., CXOs, VCXOs and/or NCXOs). In a first example implementation, each of the first, second, and third clocks 802, 804, 806 is an AFS. In a second example implementation, the first and second clocks 802, 804 are AFSs, and the third clock 806 is a CXO. In a third example implementation, the first clock 802 is an AFS, and the second and third clocks 804, 806 are CXOs. The first clock 802 outputs a first clock signal 808, the second clock 804 outputs a second clock signal 810, and the third clock 806 outputs a third clock signal 812.

The example voting architecture 800 also includes a first filter-based detector and corrector 814, a second filter-based detector and corrector 816, and a third filter-based detector and corrector 818. Each of the first, second, and third filter-based detectors and correctors 814, 816, 818 include filters (e.g., Kalman or fixed gain filters) to model an estimated difference between two of the clocks, which is used to compute a residual (e.g., the difference between the predicted clock difference and the measured clock difference), which is used to detect various types of jumps. In the example voting architecture 800 as depicted in FIG. 8, each filter-based detector and corrector corresponds to two clocks. Namely, the first filter-based detector and corrector 814 receives the first clock signal 808 and the second clock signal 810, the second filter-based detector and corrector 816 receives the second clock signal 810 and the third clock signal 812, and the third filter-based detector and corrector 818 receives the first clock signal 808 and the third clock signal 812.

Upon detection of a clock anomaly, each of the first, second, and third filter-based detectors and correctors 814, 816, 818 transmits isolation and voting information to a voter and isolator 820. Each clock transmits its respective clock signal to two of the filter-based detectors and correctors 814, 816, 818 if one of the clocks exhibits an anomaly. As a result, two of the three filter-based detectors and correctors 814, 816, 818 are impacted by the anomaly. Thus, the clock that is included in both of the filter-based detectors and correctors 814, 816, 818 impacted by the anomaly is the source of the anomaly. For example, if an anomaly is detected by the first and second filter-based detectors and correctors 814, 816, then the second clock 802 is faulty; if an anomaly is detected by the second and third filter-based detectors and correctors 816, 818, then the third clock 806 is faulty; and if an anomaly is detected by the first and third filter-based detectors and correctors 812, 816, then the first clock 802 is faulty.

Once an anomaly is detected and the particular clock that is the source of the anomaly is identified, corrections can be applied to the faulty clock identified by the voting architecture.

Figure 9:
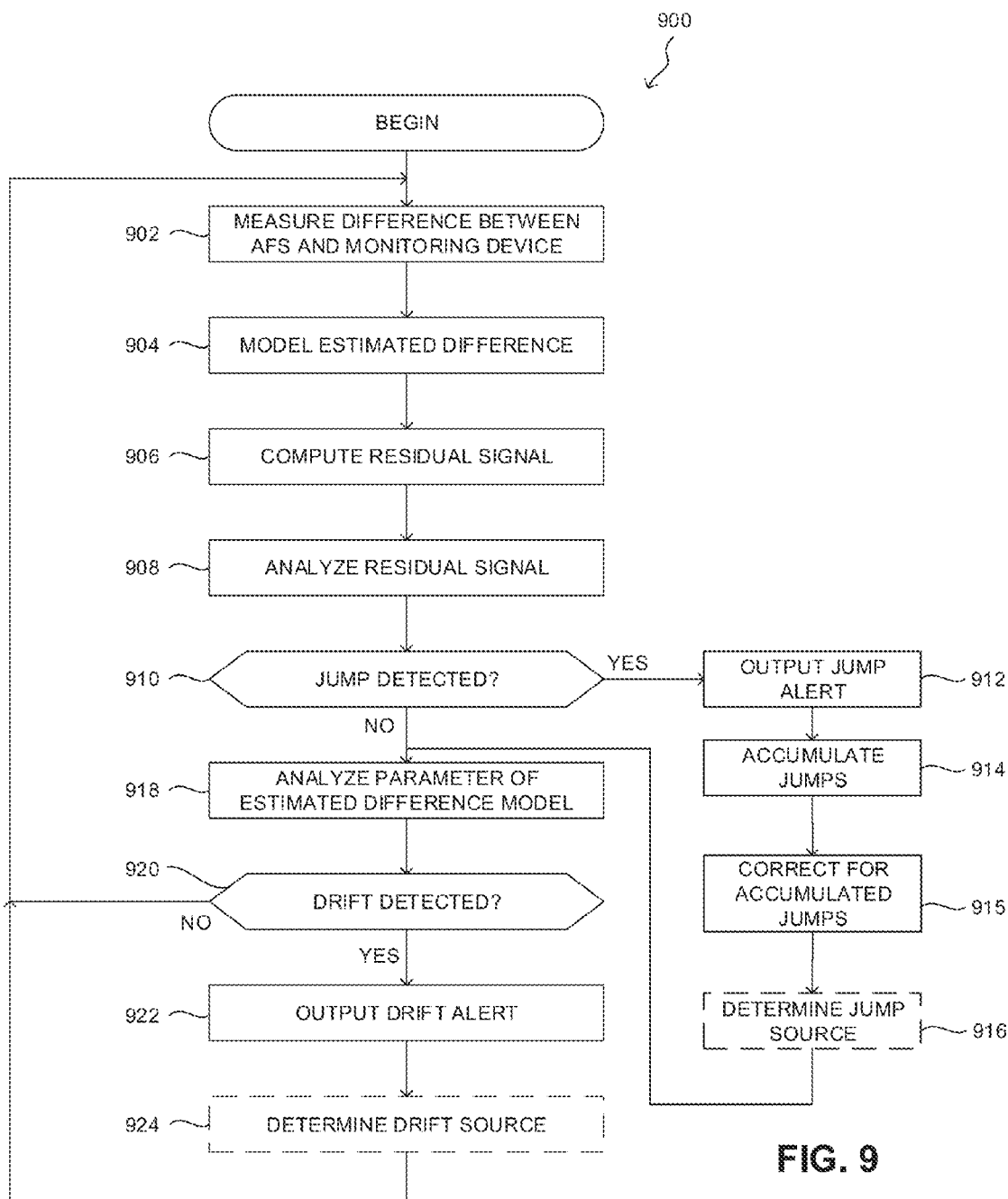
FIG. 9 is a flowchart representative of example method for implementing a clock monitoring system.

While an example manner of implementing the example clock monitoring systems 100, 200, 300, 400, 500, 600 and 700 of FIGS. 1-7 and the example voting architecture 800 of FIG. 8 is illustrated in FIG. 9, one or more of the elements, processes and/or devices illustrated in FIG. 9 may be combined, divided, re-arranged, omitted, eliminated and/or implemented in any other way. Further, the example AFS/monitoring assembly 102, 202, 302, 402; the example meter 104, 204, 504, 606, 612; the example level 1 detector 106, 206; the example jump correction accumulator 108, 208, 510; the example estimator 110, 210; the example level 2 detector 112, 212; the example AFS 114, 214, 304, 404, 502, 602; the example monitoring device 116, 216, 306, 406; the example analyzer 124; the example detector and estimator 506, 608; the example independent clock 508; the example CXO 604; the example phase-locked loop 610; the example filter 614; the example VCXO or NCO 616; the example clock 802, 804, 806; the example filter-based detector and corrector 814, 816, 818; the example voter and isolator 820; and/or, more generally, the example clock monitoring systems 100, 200, 300, 400, 500, 600 and 700 of FIGS. 1-7 and the example voting architecture 800 of FIG. 8 may be implemented by hardware, software, firmware and/or any combination of hardware, software and/or firmware. Thus, for example, any of the example AFS/monitoring assembly 102, 202, 302, 402; the example meter 104, 204, 504, 606, 612; the example level 1 detector 106, 206; the example jump correction accumulator 108, 208, 510; the example estimator 110, 210; the example level 2 detector 112, 212; the example AFS 114, 214, 304, 404, 502, 602; the example monitoring device 116, 216, 306, 406; the example analyzer 124; the example detector and estimator 506, 608; the example independent clock 508; the example CXO 604; the example phase-locked loop 610; the example filter 614; the example VCXO or NCO 616; the example clock 802, 804, 806; the example filter-based detector and corrector 814, 816, 818; the example voter and isolator 820, and/or, more generally, the example clock monitoring systems 100, 200, 300, 400, 500, 600 and 700 of FIGS. 1-7 and the example voting architecture 800 of FIG. 8 could be implemented by one or more analog or digital circuit(s), logic circuits, programmable processor(s), application specific integrated circuit(s) (ASIC(s)), programmable logic device(s) (PLD(s)) and/or field programmable logic device(s) (FPLD(s)). When reading any of the apparatus or system claims of this patent to cover a purely software and/or firmware implementation, at least one of the example, AFS/monitoring assembly 102, 202, 302, 402; the example meter 104, 204, 504, 606, 612; the example level 1 detector 106, 206; the example jump correction accumulator 108, 208, 510; the example estimator 110, 210; the example level 2 detector 112, 212; the example AFS 114, 214, 304, 404, 502, 602; the example monitoring device 116, 216, 306, 406; the example analyzer 124; the example detector and estimator 506, 608; the example independent clock 508; the example CXO 604; the example phase-locked loop 610; the example filter 614; the example VCXO or NCO 616; the example clock 802, 804, 806; the example filter-based detector and corrector 814, 816, 818; the example voter and isolator 820 are hereby expressly defined to include a tangible computer readable storage device or storage disk such as a memory, a digital versatile disk (DVD), a compact disk (CD), a Blu-ray disk, etc. storing the software and/or firmware. Further still, the example clock monitoring systems 100, 200, 300, 400, 500, 600 and 700 of FIGS. 1-7 and the example voting architecture 800 of FIG. 8 may include one or more elements, processes and/or devices in addition to, or instead of, those illustrated in FIG. 9, and/or may include more than one of any or all of the illustrated elements, processes and devices.

A flowchart representative of example method for implementing the clock monitoring systems 100, 200, 300, 400, 500, 600 and 700 of FIGS. 1-7 and the example voting architecture 800 of FIG. 8 is shown in FIG. 9. In this example, the method can be implemented by machine readable instructions comprising a program for execution by a processor such as the processor 1612 shown in the example processor platform 1600 discussed below in connection with FIG. 16. The program may be embodied in software stored on a tangible computer readable storage medium such as a CD-ROM, a floppy disk, a hard drive, a digital versatile disk (DVD), a Blu-ray disk, or a memory associated with the processor 1612, but the entire program and/or parts thereof could alternatively be executed by a device other than the processor 1612 and/or embodied in firmware or dedicated hardware. Further, although the example program is described with reference to the flowchart illustrated in FIG. 9, many other methods of implementing the example clock monitoring systems 100, 200, 300, 400, 500, 600 and 700, and the example voting architecture 800 may alternatively be used. For example, the order of execution of the blocks may be changed, and/or some of the blocks described may be changed, eliminated, or combined.

As mentioned above, the example processes of FIG. 9 may be implemented using coded instructions (e.g., computer and/or machine readable instructions) stored on a tangible computer readable storage medium such as a hard disk drive, a flash memory, a read-only memory (ROM), a compact disk (CD), a digital versatile disk (DVD), a cache, a random-access memory (RAM) and/or any other storage device or storage disk in which information is stored for any duration (e.g., for extended time periods, permanently, for brief instances, for temporarily buffering, and/or for caching of the information). As used herein, the term tangible computer readable storage medium is expressly defined to include any type of computer readable storage device and/or storage disk and to exclude propagating signals and to exclude transmission media. As used herein, "tangible computer readable storage medium" and "tangible machine readable storage medium" are used interchangeably. Additionally or alternatively, the example processes of FIG. 9 may be implemented using coded instructions (e.g., computer and/or machine readable instructions) stored on a non-transitory computer and/or machine readable medium such as a hard disk drive, a flash memory, a read-only memory, a compact disk, a digital versatile disk, a cache, a random-access memory and/or any other storage device or storage disk in which information is stored for any duration (e.g., for extended time periods, permanently, for brief instances, for temporarily buffering, and/or for caching of the information). As used herein, the term non-transitory computer readable medium is expressly defined to include any type of computer readable storage device and/or storage disk and to exclude propagating signals and to exclude transmission media. As used herein, when the phrase "at least" is used as the transition term in a preamble of a claim, it is open-ended in the same manner as the term "comprising" is open ended.

FIG. 9 is a flowchart representative of an example method 900 to monitor atomic clock signals using multi-level, multi-threshold and multi-persistency analysis. Although the flowchart of FIG. 9 is described with respect to the clock monitoring system 100 of FIG. 1, the flowchart of FIG. 9 can be implemented using any of the systems 100, 200, 300, 400, 500, 600, 700 and/or 800 of FIGS. 1-8.

At block 902, a difference between the AFS and the monitoring device is measured. For example, in the clock monitoring system 100 of FIG. 1, block 902 is performed by the meter 104, which measures the phase and/or rate difference(s) between the AFS signal 118 and the monitoring device signal 120.

At block 904, an estimated difference between the AFS and the monitoring device is modeled. In an example, the estimator 110 models the estimated phase and/or rate difference(s) 126. The estimator 110 updates its model based on the corrected residual phase and/or rate difference(s) 136 received from the level 1 detector 106.

At block 906, the residual signal is computed. In an example, the analyzer 124 receives the measured phase and/or rate difference(s) 122, the estimated phase and/or rate difference(s) 126, and the accumulated jumps 128, and computes the residual phase and/or rate difference(s) 130.

At block 908, the residual signal is analyzed. In an example, the level 1 detector 106 compares the residual phase and/or rate difference(s) 130 to multiple thresholds, each of the multiple thresholds having a corresponding persistency defining the number of times a threshold is exceeded before a jump is detected or indicated.

At block 910, a jump is detected or indicated if the residual phase and/or rate difference(s) 130 exceeds a threshold at a persistency associated with the threshold. In an example, block 910 is performed by the level 1 detector 106. In addition, the level 1 detector 106 outputs a corrected residual phase and/or rate difference(s) 136 by removing a portion of the residual phase and/or rate difference(s) 130 contributed by the jumps.

If a jump is detected or indicated at block 910, a jump alert is indicated at block 912. In an example, the jump alert is indicated by the fault indicator 134.

At block 914, jumps are accumulated. In an example, the jump correction accumulator 108 accumulates the jumps, and outputs the accumulated jumps 128 to the analyzer 124.

At block 915, the accumulated jumps are corrected. Block 915 is optionally performed by systems that include an independent clock-based monitoring system such as the system 500, for example. In an example, the phase and/or rate meter 504 receives a corrected tracked AFS signal 514 from the independent clock 508 and accumulated jump corrections 516 from the jump correction accumulator 510.

At block 916, the jump source is determined. Block 916 is optionally performed by systems that include a voting architecture 800. In an example, the voting architecture 800 determines the particular clock that is the source of the jump.

At block 918, a parameter of the estimated difference model is analyzed. In an example, the level 2 detector 112 compares a parameter of the estimated phase and/or rate difference(s) model 126 (e.g., rate bias) to multiple thresholds, each of the multiple thresholds having a corresponding persistency defining the number of times a threshold (e.g., a drift threshold) is exceeded before a drift is indicated or detected.

At block 920, a drift is detected if the parameter of the estimated phase and/or rate difference(s) model 126 (e.g., rate bias) exceeds a threshold at a persistency associated with the threshold. In an example, block 920 is performed by the level 2 detector 112.

If a drift is not detected at block 920, the example method 900 repeats at block 902. If a drift is detected at block 920, a drift alert is indicated at block 922. In an example, the drift alert is indicated by the fault indicator 140.

At block 924, the drift source is determined. Block 924 is optionally performed in systems that include a voting architecture 800. In an example, the voting architecture 800 determines the particular clock that is the source of the drift. Upon executing block 924, the example method 900 repeats at block 902.

The particular example mathematical models that are utilized to model clock operation and to detect errors (e.g., anomalies) are described below. In an example, clock error is modeled as a third-order system, given by:

$$\begin{bmatrix} \frac{d(\delta t(t))}{dt} \\ \frac{d(\delta b(k))}{dt} \\ \frac{d(\delta a(k))}{dt} \end{bmatrix} = \begin{bmatrix} 0 & 1 & 0 \\ 0 & 0 & 1 \\ 0 & 0 & 0 \end{bmatrix} \begin{bmatrix} \delta t(t) \\ \delta b(t) \\ \delta a(t) \end{bmatrix} + \begin{bmatrix} W_{prw} \\ W_{rrw} \\ W_{arw} \end{bmatrix} \begin{matrix} \text{White noise in Rate.} \\ \text{White noise in Accel.} \\ \text{White noise in Jerk.} \end{matrix} \quad (1)$$

A discrete version of (1) is given by:

$$\begin{bmatrix} \delta t(k) \\ \delta b(k) \\ \delta a(k) \end{bmatrix} = \begin{bmatrix} PhaseError \\ RateError \\ AccError \end{bmatrix} \quad (2)$$

-continued $$\begin{bmatrix} \delta t(k) \\ \delta b(k) \\ \delta a(k) \end{bmatrix} = \begin{bmatrix} 1 & \Delta t & 0.5(\Delta t)^2 \\ 0 & 1 & \Delta t \\ 0 & 0 & 1 \end{bmatrix} \begin{bmatrix} \delta t(k) \\ \delta b(k) \\ \delta a(k) \end{bmatrix} + \begin{bmatrix} W_{prw} \\ W_{rrw} \\ W_{arw} \end{bmatrix}$$

$$Q = \begin{bmatrix} \sigma_{prw}^2 \Delta t & & \\ & \sigma_{rrw}^2 \Delta t & \\ & & \sigma_{arw}^2 \Delta t \end{bmatrix}$$

A relative error model between the AFS (e.g., rubidium clock) and the CXO is used to build the detector filter. The relative error model is represented by:

$$\begin{bmatrix} \delta t(k) \\ \delta b(k) \\ \delta a(k) \end{bmatrix} = \begin{bmatrix} \text{Relative } PhaseError \\ \text{Relative } RateError \\ \text{Relative } AcceError \end{bmatrix} \quad (3)$$

$$\begin{bmatrix} \delta t(k) \\ \delta b(k) \\ \delta a(k) \end{bmatrix} = \begin{bmatrix} 1 & \Delta t & 0.5(\Delta t)^2 \\ 0 & 1 & \Delta t \\ 0 & 0 & 1 \end{bmatrix} \begin{bmatrix} \delta t(k) \\ \delta b(k) \\ \delta a(k) \end{bmatrix} + \begin{bmatrix} _{CXO}W_{prw} - _{RBX}W_{prw} \\ _{CXO}W_{rrw} - _{RBX}W_{rrw} \\ _{CXO}W_{arw} - _{RBX}W_{arw} \end{bmatrix}$$

$$Q = \begin{bmatrix} (_{cxo}\sigma_{prw}^2 + _{rbx}\sigma_{prw}^2)\Delta t & 0 & 0 \\ 0 & \sigma(_{cxo}\sigma_{rrw}^2 + _{rbx}\sigma_{rrw}^2)\Delta t & 0 \\ 0 & 0 & \sigma\begin{pmatrix} _{cxo}\sigma_{arw}^2 + \\ _{rbx}\sigma_{arw}^2 \end{pmatrix}\Delta t \end{bmatrix}$$

In an example including a three-state filter, the frequency (e.g., rate) meter is modeled. Given the state vector being:

$$\begin{bmatrix} \delta t(k) \\ \delta b(k) \\ \delta a(k) \end{bmatrix} = \begin{bmatrix} \text{Relative } PhaseError \\ \text{Relative } RateError \\ \text{Relative } AcceError \end{bmatrix} \quad (4)$$

The phase meter output is:

$$y(k) = \begin{bmatrix} 0 & 1 & 0 \end{bmatrix} \begin{bmatrix} \delta t(k) \\ \delta b(k) \\ \delta a(k) \end{bmatrix} + v(k) \quad (5)$$

In (5), v(k) is the clock rate meter error, which is a combination of (i) phase random walk noise (e.g., white noise on clock rate) of the CXO; (ii) phase random walk noise (e.g., white noise on clock rate) of the AFS; and (iii) rate measurement noise introduced by the frequency (e.g., rate and/or phase) meter. An example frequency meter design utilizes the difference of the phase meter output divided by (dt). In this design, the phase meter measurement noise is multiplied by sqrt(2)/dt to give:

$$E(v(k)v(j)) = \sigma_{rate}^2 \delta_{k,j} \quad (6)$$

Clock performance is characterized using various parameters. In an example, curve-fitting of an Alan Variance plot or a Hadamard Variance plot is used to derive parameters for finite-dimensional/causal filter implementable models. Therefore, "flicker phase/frequency/acceleration" are approximated by other terms. More specifically, in an example, the parameters that are used include (i) phase white noise ($q_0$); (ii) phase random walk/frequency white noise ($q_1$); (iii) frequency random walk/acceleration white noise ($q_2$); and (iv) acceleration random walk/jerk white noise ($q_3$).

Alan Variance & Hadamard Variance is modeled by:

$$\sigma_y^2(\tau) = 3q_0\tau^{-2} + q_1\tau^{-1} + (\tfrac{1}{3})q_2\tau + (\tfrac{1}{20})q_3\tau^3$$

$$_H\sigma_y^2(\tau) + (10/3)q_0\tau^{-2} + q_1\tau^{-1} + (\tfrac{1}{6})q_2\tau + (\tfrac{11}{120})q_3\tau^3 \quad (7)$$

In (7), $q_0$ is the variance of white phase noise (e.g., −1 slope on an AV plot); q1 is the variance of white frequency noise or phase random walk (e.g., −½ slope); $q_2$ is variance of frequency random walk (e.g., white noise on acceleration; +½ slope); and $q_3$ is variance of acceleration random walk (e.g., white noise on jerk; random run; +3/2 slope).

To evaluate the above-mentioned models, curve-fitting was performed with respect to the IIF specification, IIF typical performance, and to a Symmetricom 9500B oven-controlled crystal oscillator (OCXO). A first version of the curve-fitting results is summarized in the table below. The first version results indicate that up to more than 100 seconds of OCXO performance is better than or comparable to a rubidium atomic clock.

|  | IIF Spec Curve Fit | IIF Typical Curve Fit | Symmetricom 9500 OCXO Cure Fit |
| --- | --- | --- | --- |
| Sigma Phase White Noise | 4.23E−13 | 0 | 0 |
| Sigma Phase Random Walk | 2.90E−12 | 5.00E−13 | 1.36E−13 |
| Sigma Frequency Random Walk | 2.70E−16 | 7.07E−17 | 7.20E−15 |
| Sigma Accel Random Walk | 1.00E−22 | 1.00E−22 | 2.88E−17 |

A second version of the curve-fitting results is summarized in the table below. The second version results indicate that up to 60 seconds of OCXO performance is better than or comparable to a rubidium atomic clock.

|  | IIF Spec Curve Fit | IIF Typical Curve Fit | Symmetricom 9500 OCXO Cure Fit |
| --- | --- | --- | --- |
| Sigma Phase White Noise | 4.23E−13 | 0 | 0 |
| Sigma Phase Random Walk | 2.90E−12 | 5.00E−13 | 1.36E−13 |
| Sigma Frequency Random Walk | 2.70E−16 | 7.07E−17 | 1.20E−14 |
| Sigma Accel Random Walk | 1.00E−22 | 1.00E−22 | 2.88E−17 |

Phase and/or rate meter targets were identified based on probability analysis. Results of the analysis indicate that errors greater than $10^{-12}$ seconds and $10^{-12}$ seconds/second substantially degrade the performance of the monitoring system. Errors smaller than that do not improve performance significantly due to the performance of the AFS and CXO. Accordingly, improvement of the AFS and CXO would make further improvement of the phase and/or rate meter more worthwhile. Consequently, the target requirement for phase measurement error is $10^{-12}$ seconds and the target requirement for rate measurement error is $10^{-12}$ seconds/second.

For all architecture options, phase jumps that are greater than phase meter noise are easily detected and corrected, and rate jumps greater than rate meter noise are easily detected and corrected.

Various simulations were performed using the systems and models identified above. For the independent clock-based system, rate meter noise was assumed at a level of sigma=$10^{-12}$ seconds/second. Simulation cases including various rate jumping levels were performed for detection by level 1 and level 2 tests.

For the delay-based system, the phase meter noise was assumed at a level of $10^{-12}$ seconds, and the derived measurement noise was assumed at $10^{-12}$ seconds for a 1 second delay. Simulation cases including various rate jumping levels were performed for detection by level 1 and level 2 tests.

In addition, probability analysis was performed for level 1 rate jumps, for both delay-based and independent clock-based systems. In addition, probability analysis was performed for level 2 estimated rate bias-based detection.

Direct frequency measurement-based detection was analyzed in which a VCXO was used to generate a sampling period mT. The sampling period mT itself has noise represented by:

$$_mT = T + bT + \sigma_{prw}T^{1/2}w_1 + \tfrac{1}{3}\sigma_{rrw}T^{3/2}w_2 \qquad (8)$$

Accordingly, the clock rate bias is on the order of:

$$= (bT + \sigma_{prw}T^{1/2}w_1 + \tfrac{1}{3}\sigma_{rrw}T^{3/2}w_2) + \sigma_{pm}v_1 \qquad (9)$$

Assuming good calibration and b=0, the rate bias in 1 second is:

$$\sqrt{\sigma_{prw}^2 + (1/9)\sigma_{rrw}^2 + \sigma_{pm}^2}$$

For $\sigma_{prw} = 1e-13$ $\sigma_{prw} = 1e-16$ $\sigma_{pm} = 1e-12 \qquad (10)$ Thus, the rate bias is mostly $10^{-12}$ seconds/second. For 6-sigma detection, changes can be detected above $6 \cdot 10^{-12}$, and for 3-sigma detection, changes can be detected above $3 \cdot 10^{-12}$.

A mathematical model was developed for a clock in a clock rate update approach. The state model is given by:

$$\begin{bmatrix} \delta b(t) \\ \delta a(t) \end{bmatrix} = \begin{bmatrix} RateError \\ AcceError \end{bmatrix} \qquad (11)$$

$$\frac{d}{dt} = \begin{bmatrix} \delta b(t) \\ \delta a(t) \end{bmatrix} \begin{bmatrix} 1 & 0 \\ 0 & 0 \end{bmatrix} \begin{bmatrix} \delta b(t) \\ \delta a(t) \end{bmatrix} + \begin{bmatrix} w_{rrw} \\ w_{arw} \end{bmatrix}$$

$$w(t) = \begin{bmatrix} w_{rrw} \\ w_{arw} \end{bmatrix}$$

$$E(w(t)w(s)^T) = Q\delta(t-s) = \begin{bmatrix} \sigma_{rrw}^2 & 0 \\ 0 & \sigma_{arw}^2 \end{bmatrix} \delta(t-s)$$

Two measurement strategies are utilized for this measurement approach. First, if the AFS is assumed to have errors, three error sources are included for measurement error, including CXO phase error, AFS phase error, and phase meter error. Second, if the AFS is assumed to be perfect, the CXO is slaved to it and the AFS phase error will not be included.

Key parameters were identified and analyzed to determine considerations for optimizing the parameters. Key parameters that were identified include (1) average time/output frequency for frequency/clock rate measurements; (2) detection threshold; and (3) detection persistency.

For the average time/output frequency for frequency/clock rate measurements, it was found that longer average time reduces noise. However, 5.2 seconds of detection time and persistency limit this value.

For the detection threshold, it was found that a lower threshold facilitates detection but results in greater instances of false alarms. In contrast, a higher threshold results in a high probability of missed detection. Accordingly, a low threshold with persistency typically provides a better solution.

Detection persistency was found to be driven by the false alarm requirements. However, 5.2 seconds of detection time provides only limited available persistency.

Simulation and analysis indicates that the probability of detection is improved by using a lower threshold with persistency, which reduces false alarms. Thus, a persistency of four (e.g., four measurements at a particular threshold must be realized before an anomaly is detected) was selected for the simulation and analysis. Thus, the average time should be about 1 second given a 5.2 second detection time requirement, given that the magnitude of a frequency jump can be unbounded. Thus, a value of 1 second was selected for simulation and analysis. Consequently the threshold was selected at 2*sigma of the residual to help the detection probability.

Probability of detection and false alarms is modeled as:

$$P(|x| < \alpha\sigma) = erf(\alpha/\sqrt{2}) \qquad (12)$$

In an example, $P(|x| < 3\sigma) = erf(3/\sqrt{2}) = 0.9973$ $P(|x| > \alpha\sigma) = 1 - P(|x| < \alpha\sigma) = 1 - erf(\alpha/\sqrt{2})$ $$P(|x| > \alpha\sigma) = P(x > \alpha\sigma) + P(x < -\alpha\sigma) = 2P(x > \alpha\sigma) = 2P(x < -\alpha\sigma) \qquad (13)$$

Consequently, $$P(x > \alpha\sigma) = P(x < -\alpha\sigma) = 0.5P(|x| > \alpha\sigma) = 0.5(1 - erf(\alpha/\sqrt{2})) \qquad (14)$$

In an application of (14),

For $\beta > \alpha$ $$P(x + \beta\sigma < \alpha\sigma) = P(x < -(\beta-\alpha)\sigma) = 0.5(1 - erf((\beta-\alpha)/\sqrt{2})) \qquad (15)$$

Results of probability simulations indicate that if an anomaly was measured above a threshold for four consecutive times, it is detected. Given the probability for a sample to be above a threshold P, the probability of detection is: $P^4$. Accordingly, the probability of a missed detection is:

$$1 - (1 - P^4)^n \qquad (16)$$

In other words, the system must fail to detect an anomaly in all "n" attempts for the anomaly to go undetected. In addition, as long as an anomaly has not been corrected, the system continues to attempt detect the anomaly.

The impact of false alarms and missed detections was analyzed. In some situations, because jumps are detected and corrected simultaneously, false alarms are effectively reduced to false corrections. Because false alarms are caused by low level anomalous frequency data, those corrections are typically very small and, generally, harmless. However, in some examples, false and/or large phase and frequency detections may lead to unavailability of service.

Missed detection occurs due to anomalies exhibiting very small frequency jumps for which a distinctive signature is difficult to identify from the filter (e.g., Kalman filter) residual. However, even a small undetected constant jump can create a large error over time. Thus, missed detections are generally undesirable due to the accumulation of errors.

Thus, it may be desirable to reduce the probability of missed detection by allowing higher false alarm probability. In a "detect/correct" architecture, false alarms, as mentioned earlier, may not be harmful in some examples. The probability of missed detection is fundamentally limited by frequency meter accuracy and short term stability of the CXO.

Figure 10:
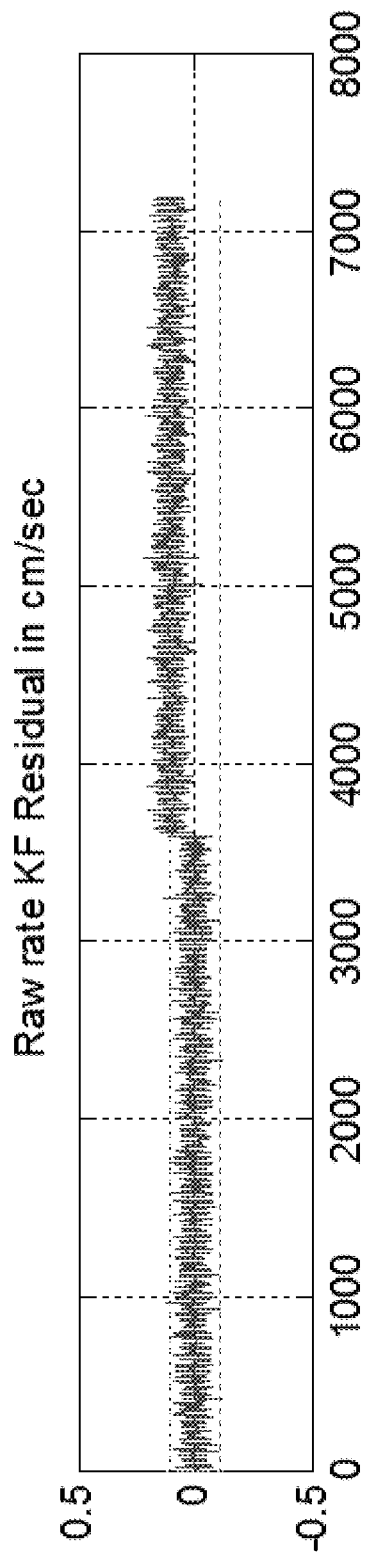
FIG. 10 illustrates a raw residual rate difference plot.
Figure 11:
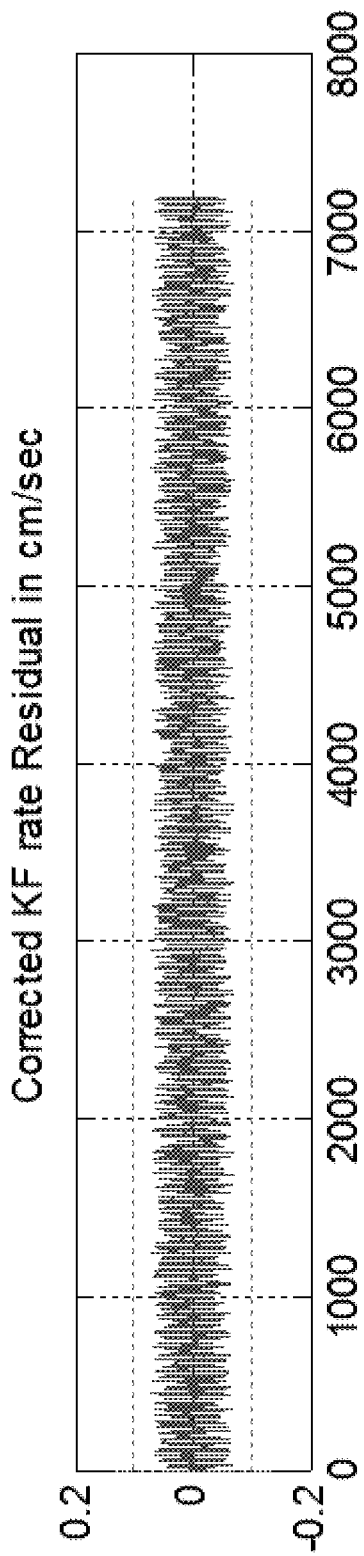
FIG. 11 illustrates a raw residual rate difference plot including jump corrections.

FIGS. 10-14 illustrate a clock rate jump of $3\cdot 10^{-12}$ seconds that is detected by a level 1 detector. The plots of FIGS. 10-14 are example measurements of the systems 100, 200, 500, 600, or 700. Turning to FIG. 10, a raw residual rate difference plot is illustrated. With respect to the system 100 of FIG. 1, the raw residual rate difference of FIG. 10 represents the residual rate difference 130 that does not include the jump corrections 128. At approximately 3600 seconds, a rate jump of $3\cdot 10^{-12}$ seconds was detected by the level 1 detector. FIG. 11 illustrates the residual rate difference 130 including the jump corrections 128. As shown in FIG. 11, the residual is significantly improved after the jump correction is implemented.

Figure 12:
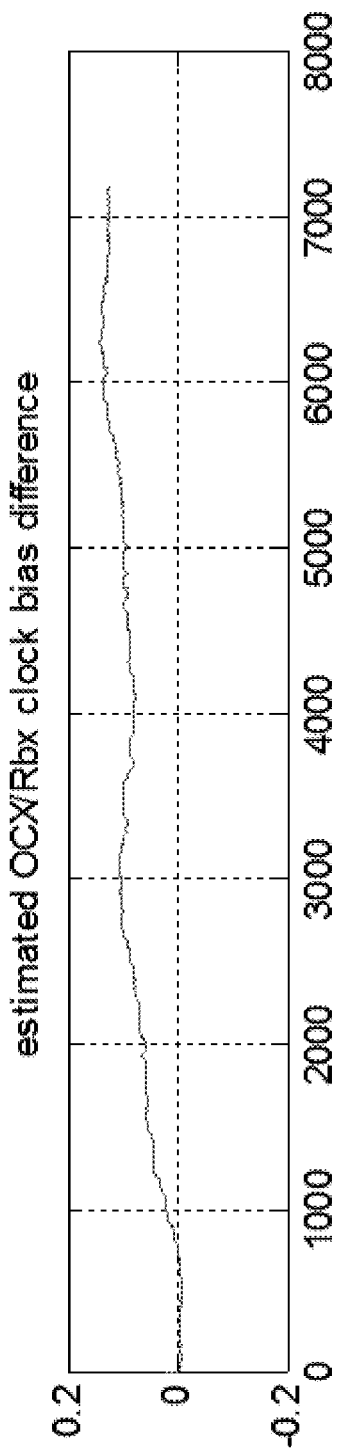
FIG. 12 illustrates an estimated clock bias plot.
Figure 13:
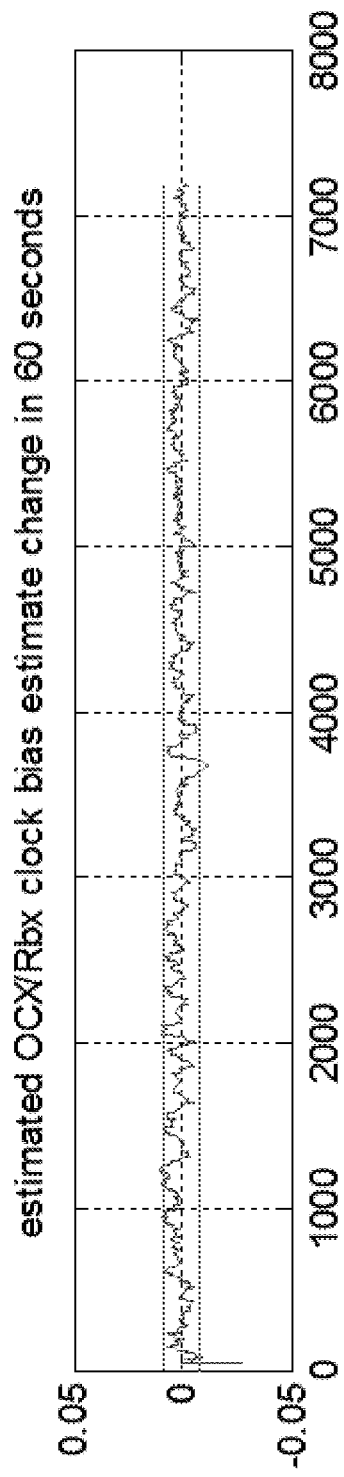
FIG. 13 illustrates an estimated clock bias plot including jump corrections.

FIGS. 12 and 13 illustrate estimated clock bias. FIG. 12 illustrates estimated clock bias without including jump corrections, and FIG. 13 illustrates estimated clock bias including jump corrections. As shown in FIG. 13, estimated clock bias is significantly improved after the jump correction is implemented.

Figure 14:
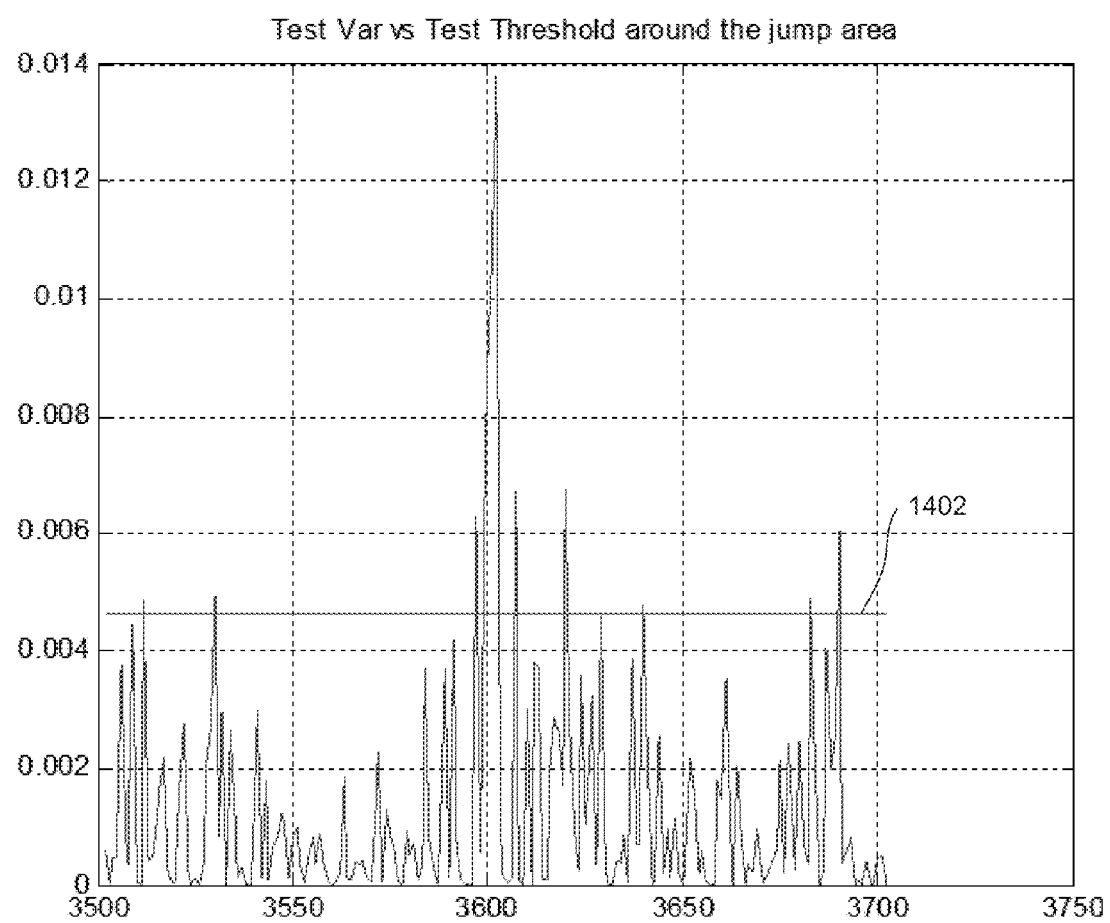
FIG. 14 illustrates a residual rate difference plot.

FIG. 14 illustrates the residual rate difference over time. FIG. 14 includes a 2 sigma threshold 1402. FIG. 14 shows that analyzing the signal in terms of persistency with respect to given threshold values is helpful to identify errors while reducing the probability of false alarms. The example of FIG. 14 utilizes a persistency of 4 at the 2 sigma threshold 1402. The peak at approximately 3600 seconds is identified as an anomaly because it is the fourth measurement above the threshold 1402. Additionally or alternatively, the peak at approximately 3600 seconds could be identified by a higher threshold with lower persistency.

Figure 15:
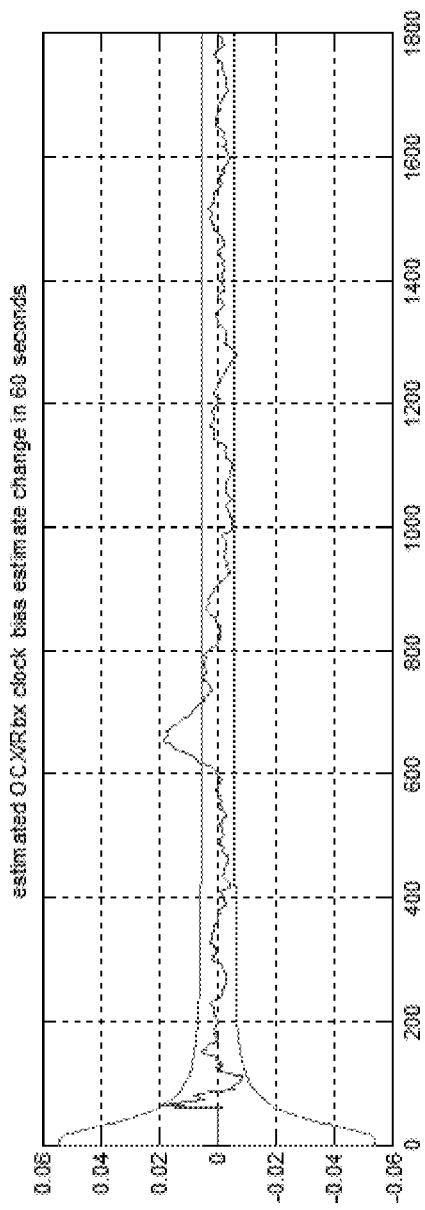
FIG. 15 illustrates results from a level 2 detector.

FIG. 15 illustrates a clock rate jump that was not detected by a level 1 detector, but caused a drift that was detected by a level 2 detector. More specifically, FIG. 15 illustrates estimated rate bias over a time period of 60 seconds. In this example, a jump of approximately $10^{-12}$ seconds/second caused a rate bias drift that exceeded a predetermined threshold, thereby indicating an anomalous clock drift. Thus, FIG. 15 illustrates that the level 2 detector is capable of detecting certain small anomalies that are not detectable by the level 1 detector.

Figure 16:
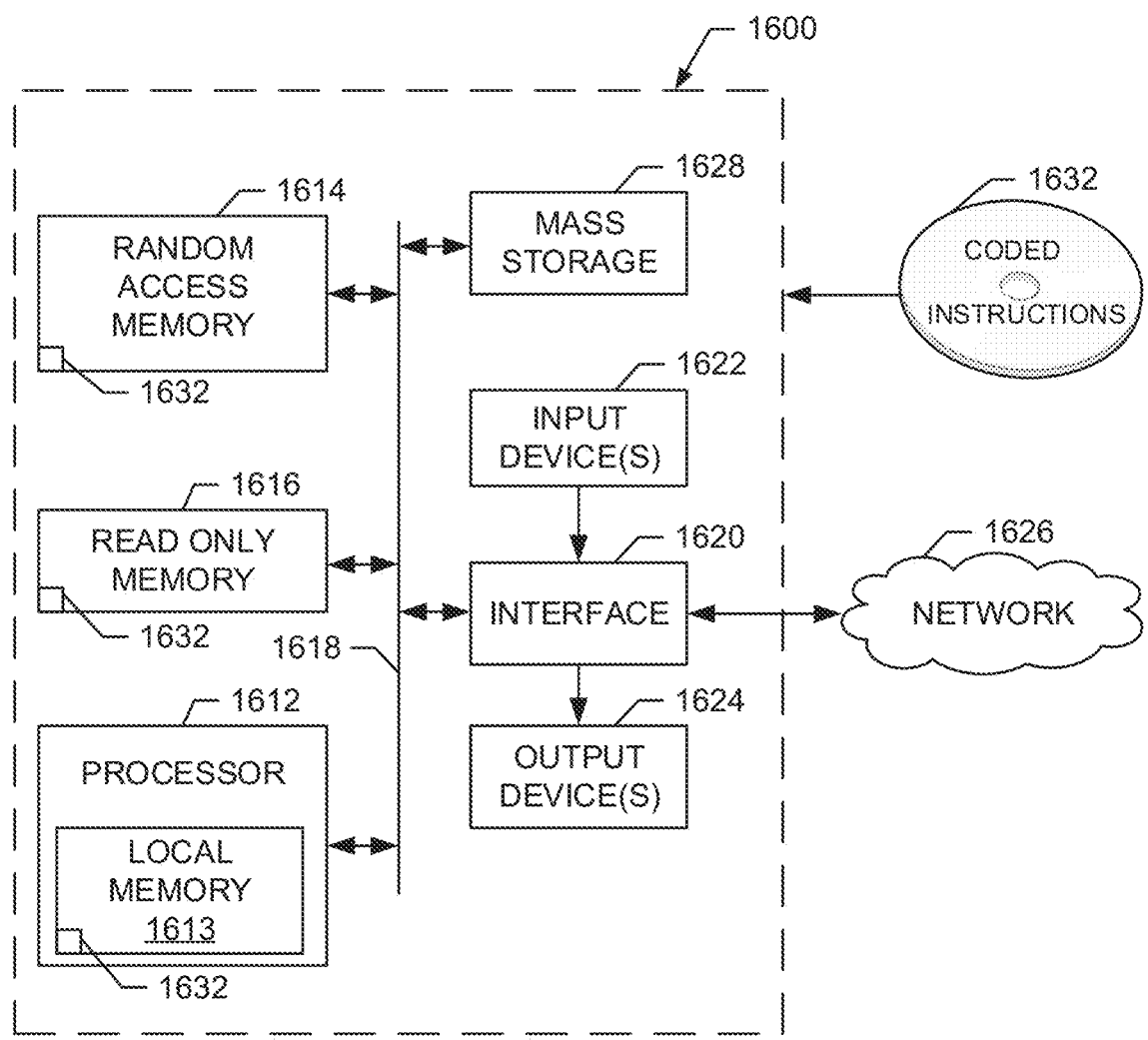
FIG. 16 is a block diagram of an example processing platform capable of executing machine readable instructions to implement the instructions of FIG. 9.

FIG. 16 is a block diagram of an example processor platform 1600 capable of executing the instructions of FIG. 9 to implement the clock monitoring systems 100, 200, 300, 400, 500, 600 and 700, and the example voting architecture 800 of FIGS. 1-8. The processor platform 1600 can be, for example, a computer processor, an FPGA (Field Programmable Gate Array) or an ASIC (application specific integrated circuit) a server, a personal computer, a mobile device (e.g., a cell phone, a smart phone, a tablet such as an iPad™), a personal digital assistant (PDA), an Internet appliance, a DVD player, a CD player, a digital video recorder, a Blu-ray player, a gaming console, a personal video recorder, a set top box or any other type of computing device.

The processor platform 1600 of the illustrated example includes a processor 1612. The processor 1612 of the illustrated example is hardware. For example, the processor 1612 can be implemented by one or more integrated circuits, logic circuits, microprocessors or controllers from any desired family or manufacturer.

The processor 1612 of the illustrated example includes a local memory 1613 (e.g., a cache). The processor 1612 of the illustrated example is in communication with a main memory including a volatile memory 1614 and a non-volatile memory 1616 via a bus 1618. The volatile memory 1614 may be implemented by Synchronous Dynamic Random Access Memory (SDRAM), Dynamic Random Access Memory (DRAM), RAMBUS Dynamic Random Access Memory (RDRAM) and/or any other type of random access memory device. The non-volatile memory 1616 may be implemented by flash memory and/or any other desired type of memory device. Access to the main memory 1614, 1616 is controlled by a memory controller.

The processor platform 1600 of the illustrated example also includes an interface circuit 1620. The interface circuit 1620 may be implemented by any type of interface standard, such as an Ethernet interface, a universal serial bus (USB), and/or a PCI express interface.

In the illustrated example, one or more input devices 1622 are connected to the interface circuit 1620. The input device(s) 1622 permit(s) a user to enter data and commands into the processor 1612. The input device(s) can be implemented by, for example, an audio sensor, a microphone, a camera (still or video), a keyboard, a button, a mouse, a touchscreen, a track-pad, a trackball, isopoint and/or a voice recognition system.

One or more output devices 1624 are also connected to the interface circuit 1620 of the illustrated example. The output devices 1624 can be implemented, for example, by display devices (e.g., a light emitting diode (LED), an organic light emitting diode (OLED), a liquid crystal display, a cathode ray tube display (CRT), a touchscreen, a tactile output device, a light emitting diode (LED), a printer and/or speakers). The interface circuit 1620 of the illustrated example, thus, typically includes a graphics driver card, a graphics driver chip or a graphics driver processor.

The interface circuit 1620 of the illustrated example also includes a communication device such as a transmitter, a receiver, a transceiver, a modem and/or network interface card to facilitate exchange of data with external machines (e.g., computing devices of any kind) via a network 1626 (e.g., an Ethernet connection, a digital subscriber line (DSL), a telephone line, coaxial cable, a cellular telephone system, etc.).

The processor platform 1600 of the illustrated example also includes one or more mass storage devices 1628 for storing software and/or data. Examples of such mass storage devices 1628 include floppy disk drives, hard drive disks, compact disk drives, Blu-ray disk drives, RAID systems, and digital versatile disk (DVD) drives.

The coded instructions 1632 of FIG. 9 may be stored in the mass storage device 1628, in the volatile memory 1614, in the non-volatile memory 1616, and/or on a removable tangible computer readable storage medium such as a CD or DVD such as a PROM, Flash Memory, or EEPROM.

From the foregoing, it will appreciate that the above disclosed methods, apparatus and articles of manufacture utilize innovative analysis techniques to provide comprehensive atomic clock monitoring capabilities that are beyond the capabilities of known systems. By utilizing multi-level detection, and multi-threshold and multi-persistency analysis for each detection level, atomic clock anomalies can be detected and corrected at levels that were previously undetectable on board GNSS satellites.

Although certain example methods, apparatus and articles of manufacture have been disclosed herein, the scope of coverage of this patent is not limited thereto. On the contrary, this patent covers all methods, apparatus and articles of manufacture fairly falling within the scope of the claims of this patent.

What is claimed is:

1. A method, comprising:
establishing a measured difference of at least one of a phase or a frequency between an atomic frequency standard (AFS) and a monitoring device;
modeling an estimated difference model associated with the at least one of the phase or the frequency between the AFS and the monitoring device;
computing a residual signal based on the measured difference and the estimated difference model;
analyzing, by a first detector, the residual signal at multiple thresholds, each of the thresholds having a corresponding persistency defining a number of times a threshold is exceeded before one or more of a phase jump, a rate jump, or an acceleration error is indicated; and
analyzing, by a second detector, a parameter of the estimated difference model at multiple thresholds, each of the thresholds having a corresponding persistency defining the number of times a drift threshold is exceeded before a drift is indicated.

2. The method as defined in claim 1, further comprising determining, by a voting architecture, a source of the jump or a source of the drift.

3. The method as defined in claim 1, wherein the parameter is rate bias.

4. The method as defined in claim 1, wherein the monitoring device is an independent clock.

5. The method as defined in claim 4, wherein the independent clock is a voltage controlled oscillator or a numerically controlled oscillator.

6. The method as defined in claim 4, wherein the independent clock is a crystal oscillator and a voltage controlled oscillator or numerically controlled oscillator.

7. The method as defined in claim 4, wherein the independent clock is a crystal oscillator.

8. The method as defined in claim 1, wherein the monitoring device is a delayed clock signal of the AFS.

9. The method as defined in claim 8, wherein the delayed clock signal is created using an oscillator-based delay mechanism.

10. The method as defined in claim 8, wherein the delayed clock signal is created using a delay line.

11. An apparatus, comprising:
a meter to measure a difference of at least one of a phase or a frequency between an atomic frequency standard (AFS) and a monitoring device;
an estimator to model an estimated difference of the at least one of the phase or the frequency between the AFS and the monitoring device;
an analyzer to compute a residual signal based on the measured difference and the estimated difference;
a first detector to analyze the residual signal at multiple thresholds, each of the thresholds having a corresponding persistency defining a number of times a threshold is exceeded before one or more of a phase jump, a rate jump, or an acceleration error is indicated; and
a second detector to analyze a parameter of the estimated difference at multiple thresholds, each of the thresholds having a corresponding persistency defining the number of times a drift threshold is exceeded before a drift is indicated.

12. The apparatus as defined in claim 11, further comprising a voting architecture to determine a source of the jump or a source of the drift.

13. The apparatus as defined in claim 11, wherein the parameter is rate bias.

14. The apparatus as defined in claim 11, wherein the monitoring device is an independent clock.

15. The apparatus as defined in claim 11, wherein the monitoring device is a delayed clock signal of the AFS.

16. A method, comprising:
establishing a measured difference of at least one of a phase or a frequency between an atomic frequency standard (AFS) and a monitoring device;
modeling an estimated difference model associated with the at least one of the phase or the frequency between the AFS and the monitoring device; and
detecting, by a detector, a drift if a parameter of the estimated difference model exceeds a threshold at a corresponding persistency defining a number of times that a drift threshold is exceeded before a drift is indicated.

17. The method of claim 16, further comprising:
analyzing, by the detector, the parameter of the estimated difference model at multiple thresholds, each of the thresholds having a corresponding persistency defining the number of times a drift threshold is exceeded before a drift is indicated.

18. The method as defined in claim 16, wherein the parameter is rate bias.

19. The method as defined in claim 16, wherein the monitoring device is an independent clock.

20. The method as defined in claim 16, wherein the monitoring device is a delayed clock signal of the AFS.

* * * * *